(12) United States Patent
Miura et al.

(10) Patent No.: US 7,817,462 B2
(45) Date of Patent: Oct. 19, 2010

(54) MAGNETIC RANDOM ACCESS MEMORY

(75) Inventors: Sadahiko Miura, Tokyo (JP); Tadahiko Sugibayashi, Tokyo (JP); Tetsuhiro Suzuki, Tokyo (JP)

(73) Assignee: Nec Corporation, Tokyo (JP)

( * ) Notice: Subject to any disclaimer, the term of this patent is extended or adjusted under 35 U.S.C. 154(b) by 481 days.

(21) Appl. No.: 11/887,631

(22) PCT Filed: Mar. 23, 2006

(86) PCT No.: PCT/JP2006/305789

§ 371 (c)(1),
(2), (4) Date: Oct. 1, 2007

(87) PCT Pub. No.: WO2006/104002

PCT Pub. Date: Oct. 5, 2006

(65) Prior Publication Data

US 2009/0141540 A1 Jun. 4, 2009

(30) Foreign Application Priority Data

Mar. 29, 2005 (JP) .............................. 2005-095486

(51) Int. Cl.
*G11C 11/00* (2006.01)
(52) U.S. Cl. ..................... 365/158; 365/171; 365/173
(58) Field of Classification Search ................. 365/158, 365/171, 173
See application file for complete search history.

(56) References Cited

U.S. PATENT DOCUMENTS

| 5,640,343 A | 6/1997 | Gallagher et al. |
| 6,545,906 B1 | 4/2003 | Savtchenko et al. |
| 7,035,137 B2 * | 4/2006 | Iwata et al. ................. 365/158 |
| 7,079,414 B2 * | 7/2006 | Iwata et al. ................. 365/158 |
| 7,099,184 B2 * | 8/2006 | Sugibayashi et al. ........ 365/158 |
| 7,440,314 B2 * | 10/2008 | Sakimura et al. ............ 365/158 |
| 2004/0228198 A1 * | 11/2004 | Shimizu ..................... 365/232 |
| 2008/0013358 A1 * | 1/2008 | Ooishi ......................... 365/63 |

FOREIGN PATENT DOCUMENTS

| JP | 2005-266651 | 10/1993 |
| JP | 2002-151758 | 5/2002 |
| JP | 2003-16779 | 1/2003 |
| JP | 2003-298023 | 10/2003 |
| JP | 2003-331574 | 11/2003 |
| JP | 2004-86986 | 3/2004 |
| JP | 2004-87870 | 3/2004 |

\* cited by examiner

*Primary Examiner*—Tuan T. Nguyen
(74) *Attorney, Agent, or Firm*—Young & Thompson

(57) ABSTRACT

MRAM includes a first wiring, a second wiring, and a memory cell. The first wiring extends to a first direction, and the second wiring extends to a second direction. The memory cell includes a free magnetic layer in which a plurality of magnetic layers coupled anti-ferromagnetically through non-magnetic layers are laminated, and is provided at an intersection of the first and second wirings. The magnetization direction of the free magnetic layer is different from the first and second directions. The writing method includes (a) reading a first data stored in the memory cell; (b) comparing a second data to be written to the memory cell and the first data; and (c) changing a direction of a first write current supplied to the first wiring and a direction of the second write current to be supplied to the second wiring, when the first data and second data are different.

25 Claims, 33 Drawing Sheets

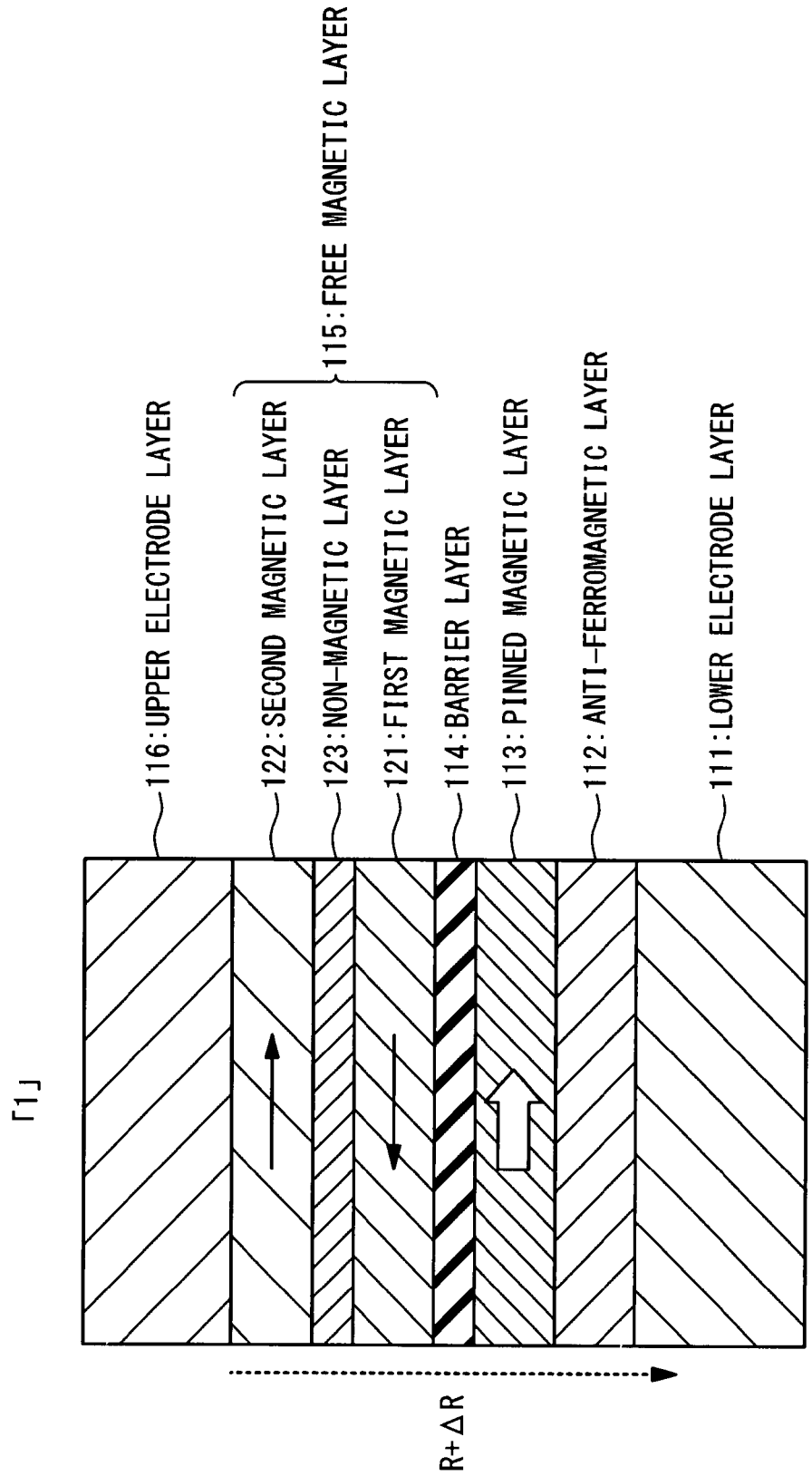
Fig. 1 RELATED ART

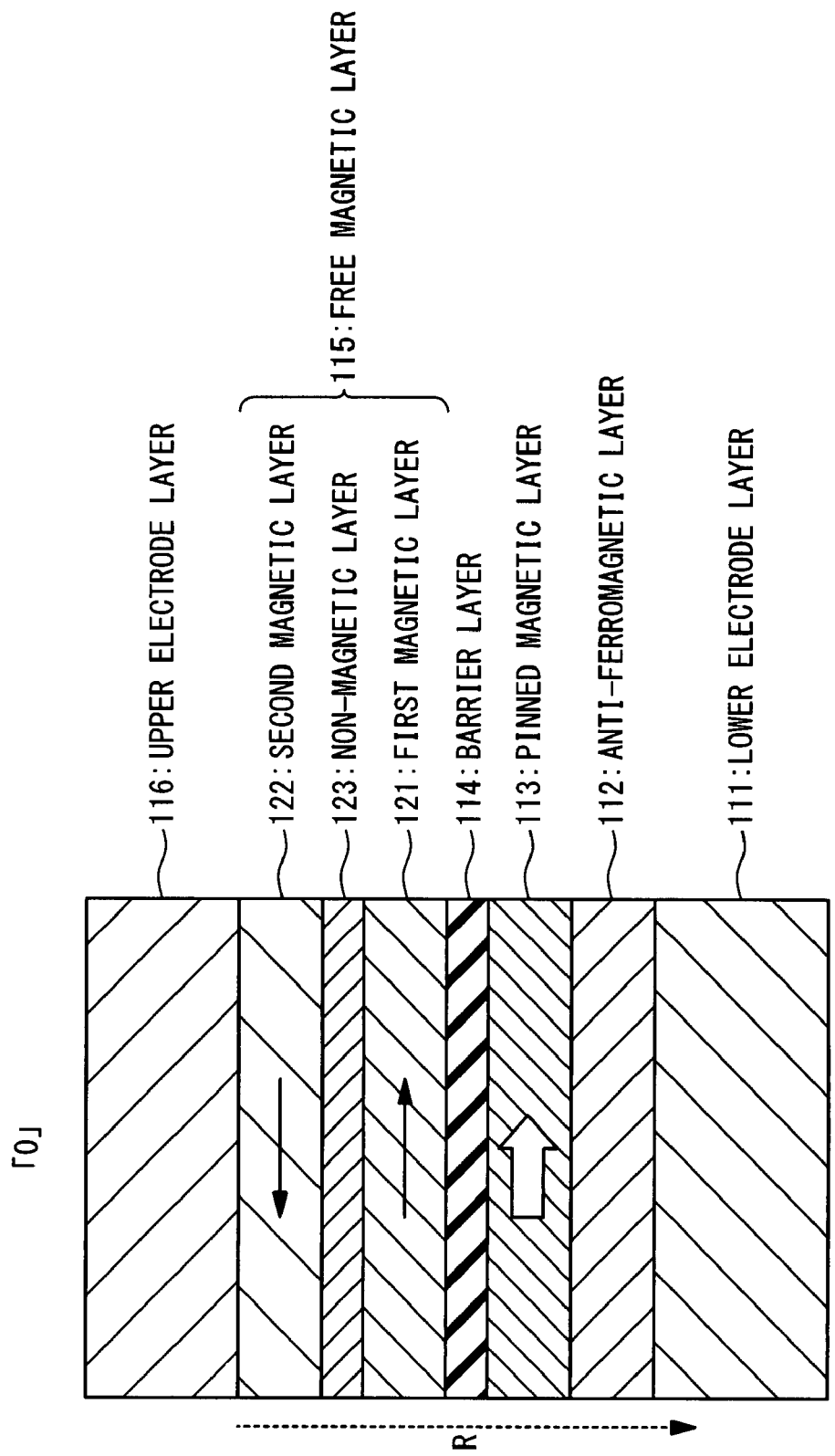
Fig. 2 RELATED ART

Fig. 3 RELATED ART
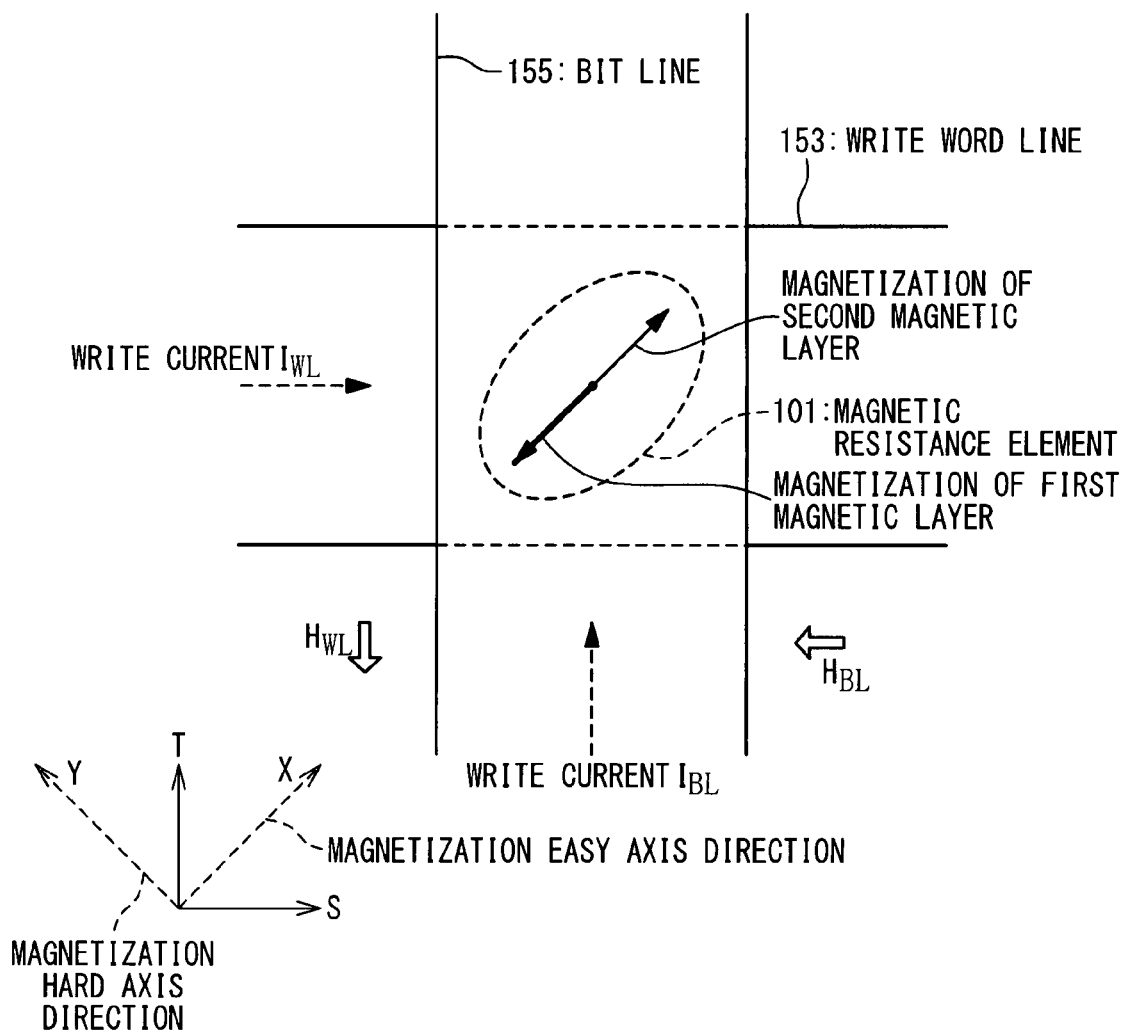

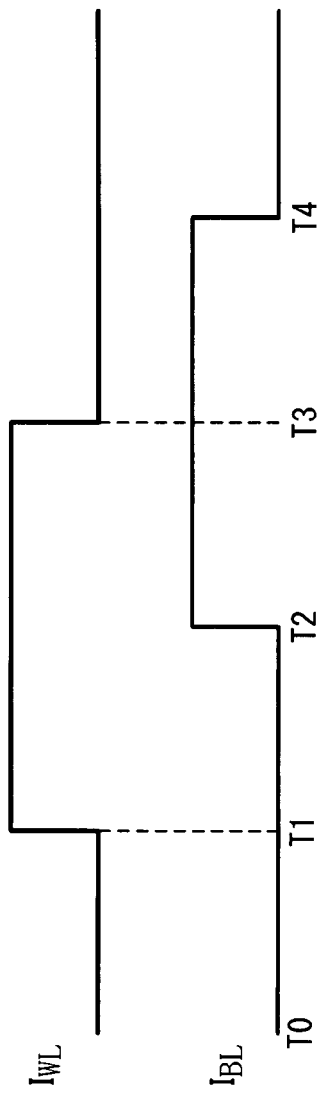
Fig. 4A
RELATED ART
Fig. 4B
RELATED ART

Fig. 5 RELATED ART
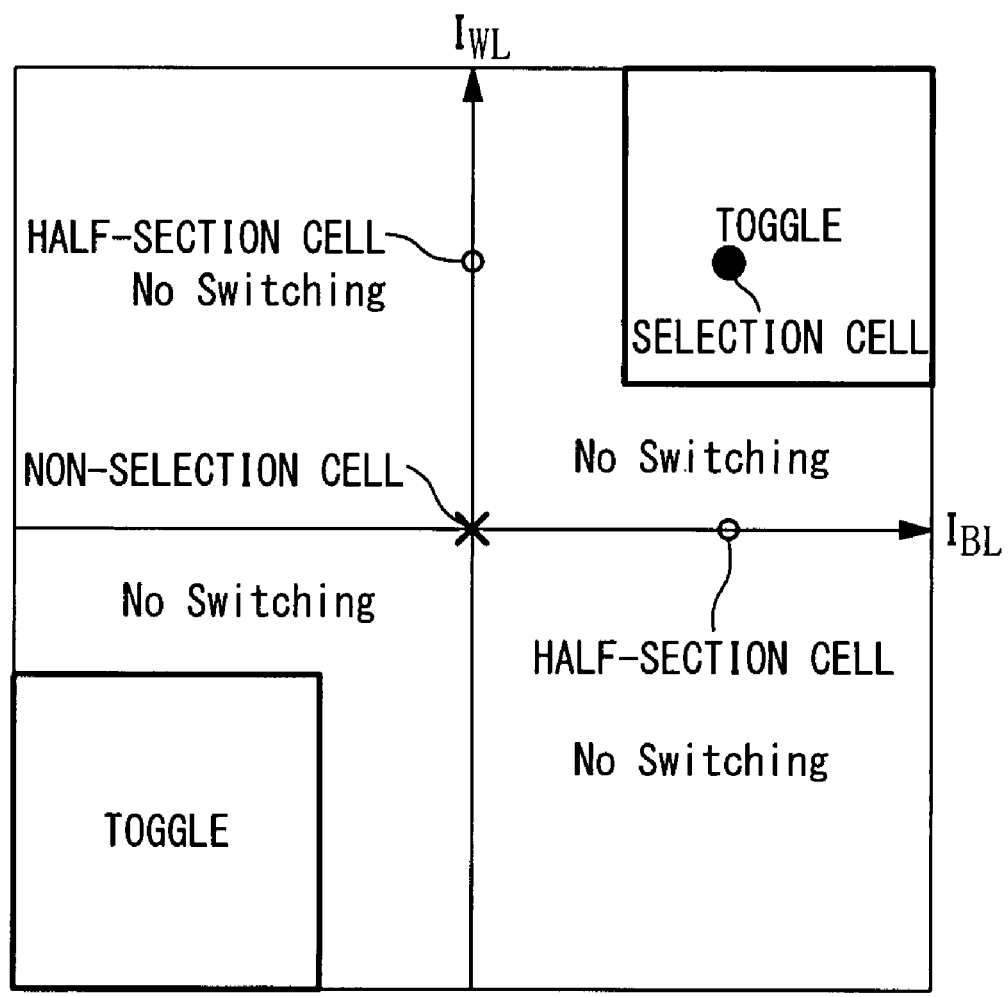

Fig. 6 RELATED ART
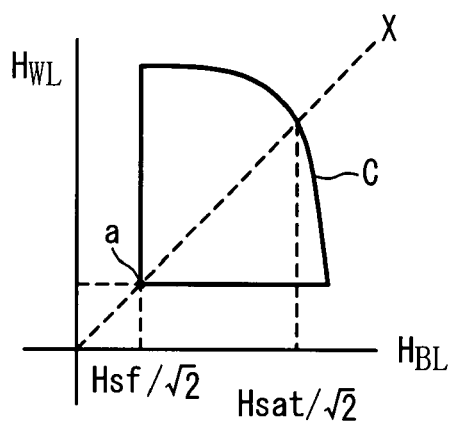
Fig. 7 RELATED ART
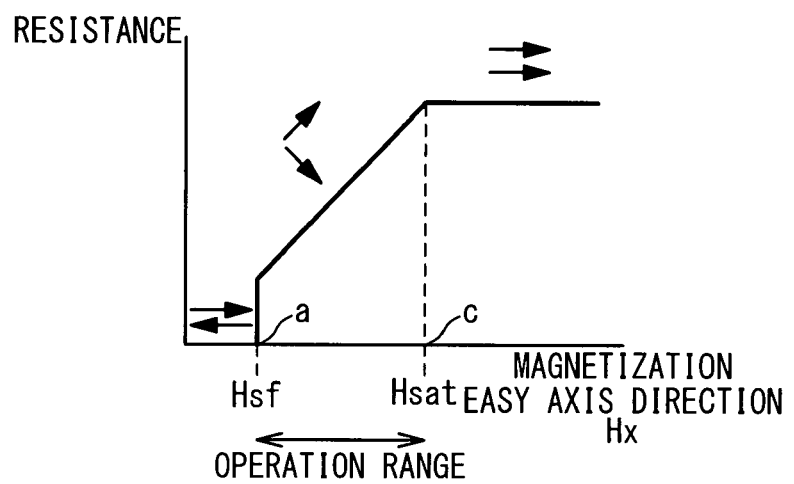

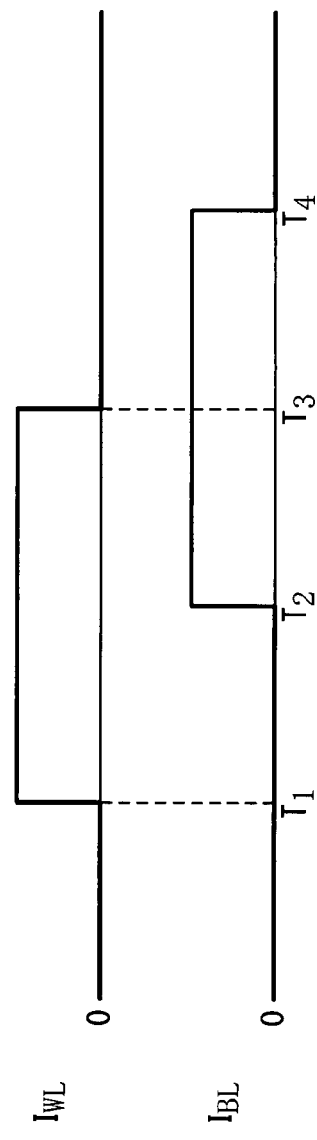
Fig. 8A
RELATED ART
Fig. 8B
RELATED ART

Fig. 9A RELATED ART
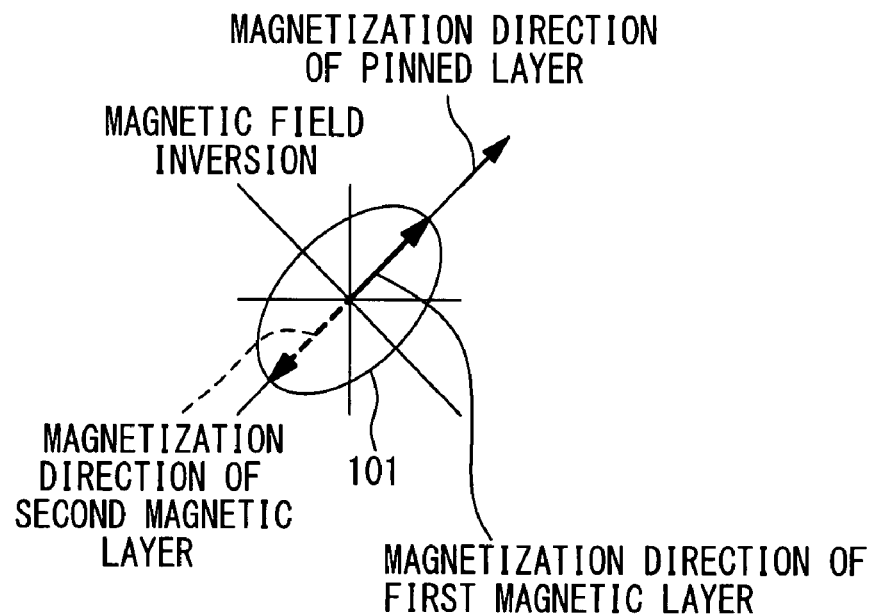
Fig. 9B RELATED ART
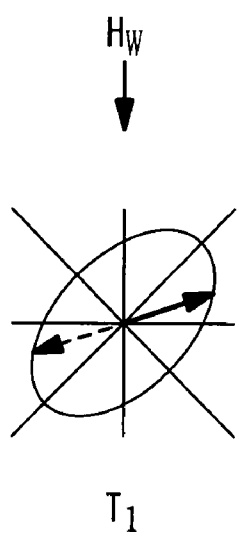

Fig. 9C RELATED ART
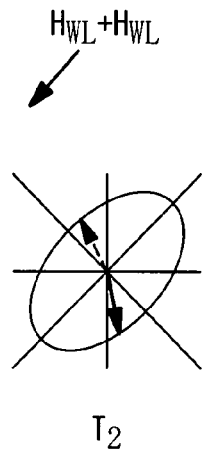
$H_{WL} + H_{WL}$
$T_2$
Fig. 9D RELATED ART
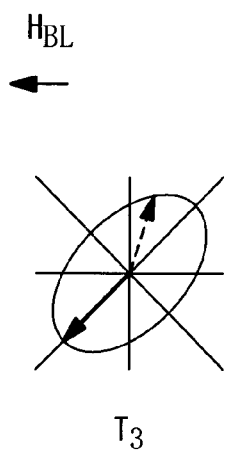
$H_{BL}$
$T_3$
Fig. 9E RELATED ART
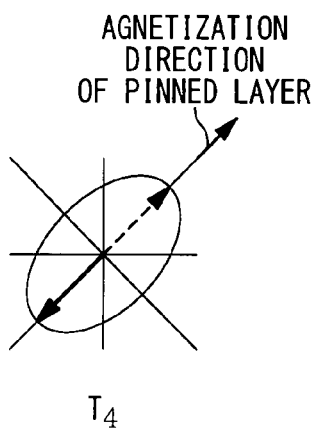
AGNETIZATION
DIRECTION
OF PINNED LAYER
$T_4$

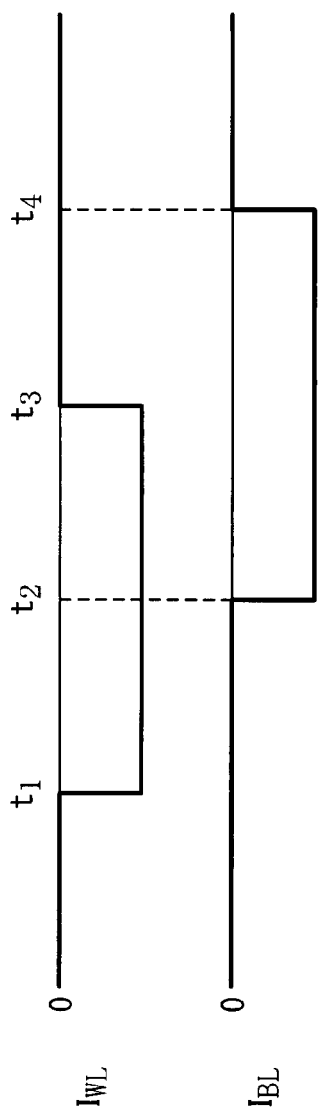
Fig. 10A
RELATED ART
Fig. 10B
RELATED ART

Fig. 11A RELATED ART
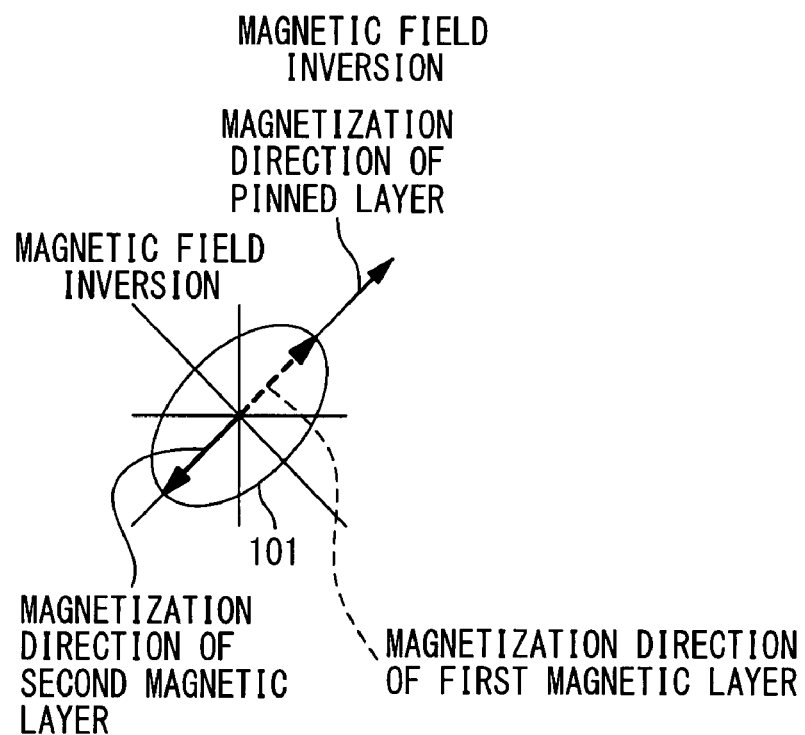
Fig. 11B RELATED ART
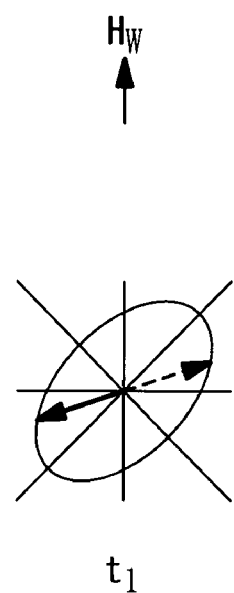

Fig. 11C RELATED ART
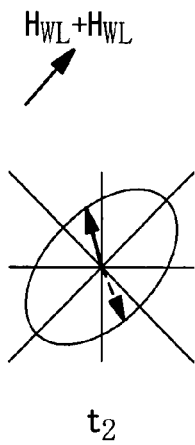
$t_2$
Fig. 11D RELATED ART
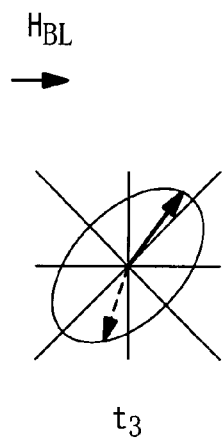
$t_3$
Fig. 11E RELATED ART
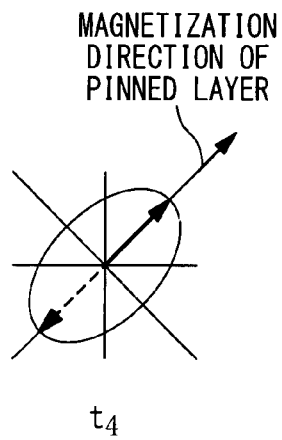
$t_4$

Fig.12 RELATED ART
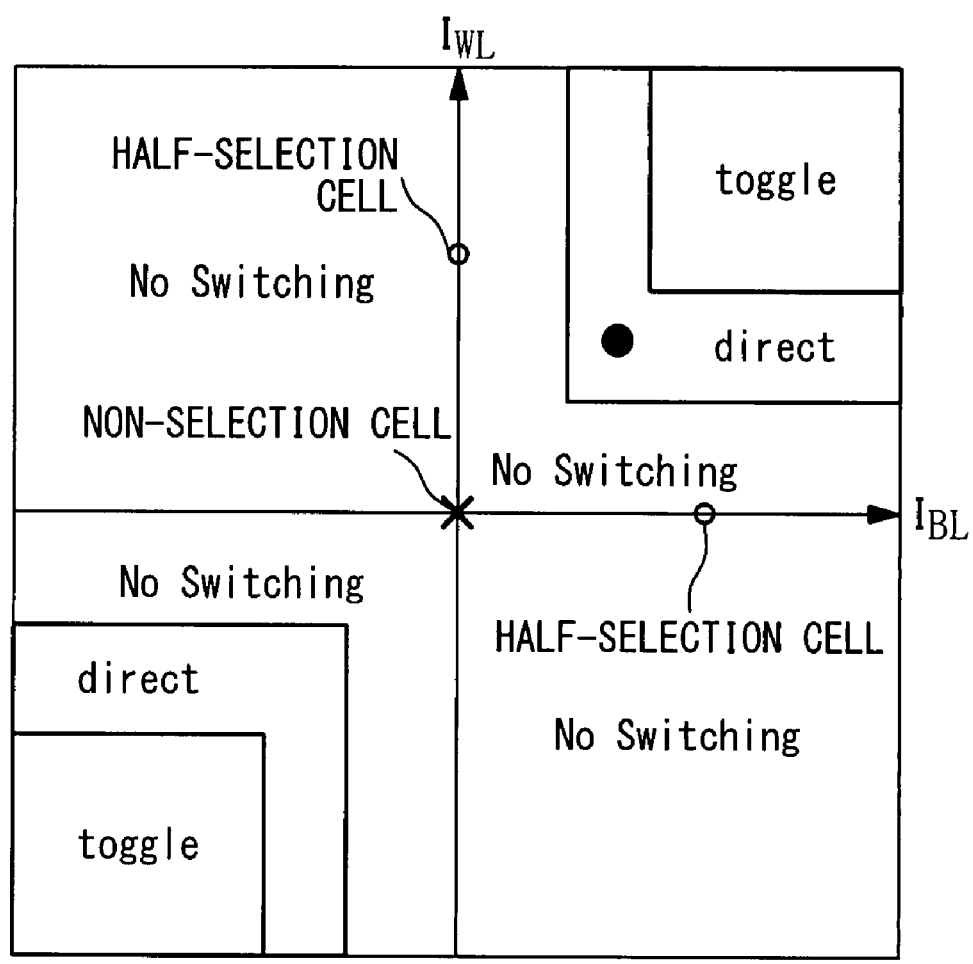

Fig. 13 RELATED ART
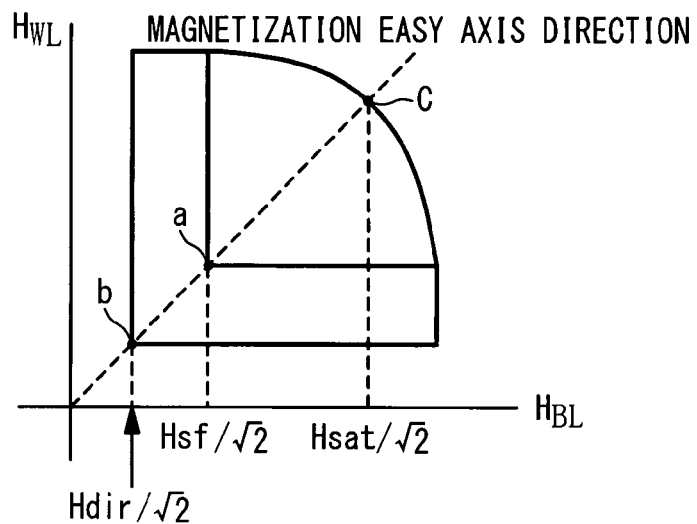
Fig. 14 RELATED ART
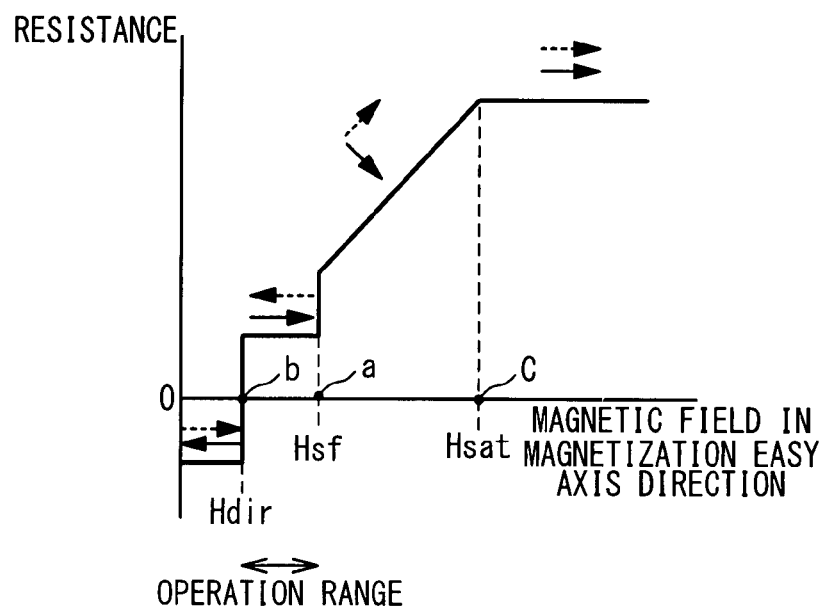

Fig. 15
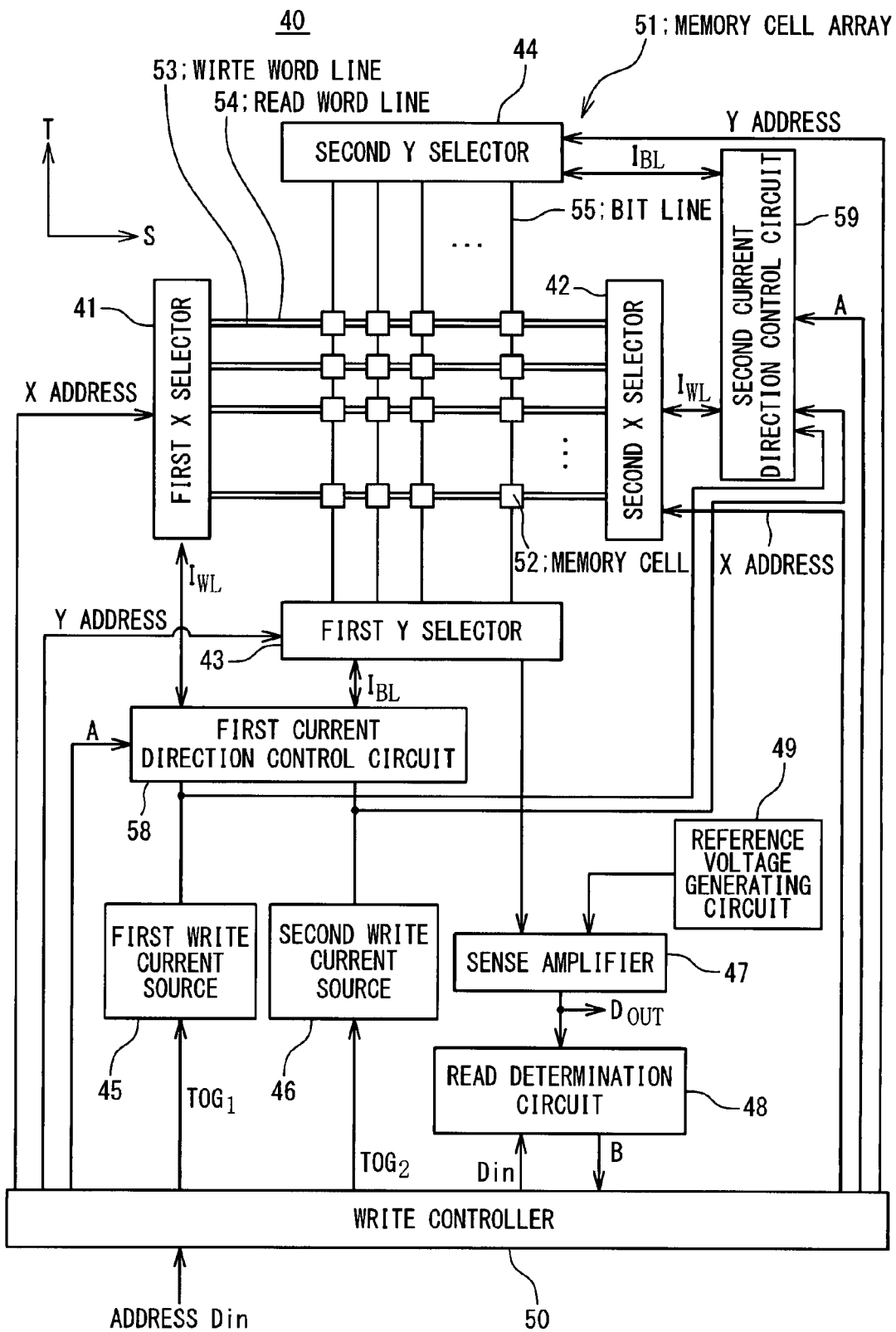

Fig. 16
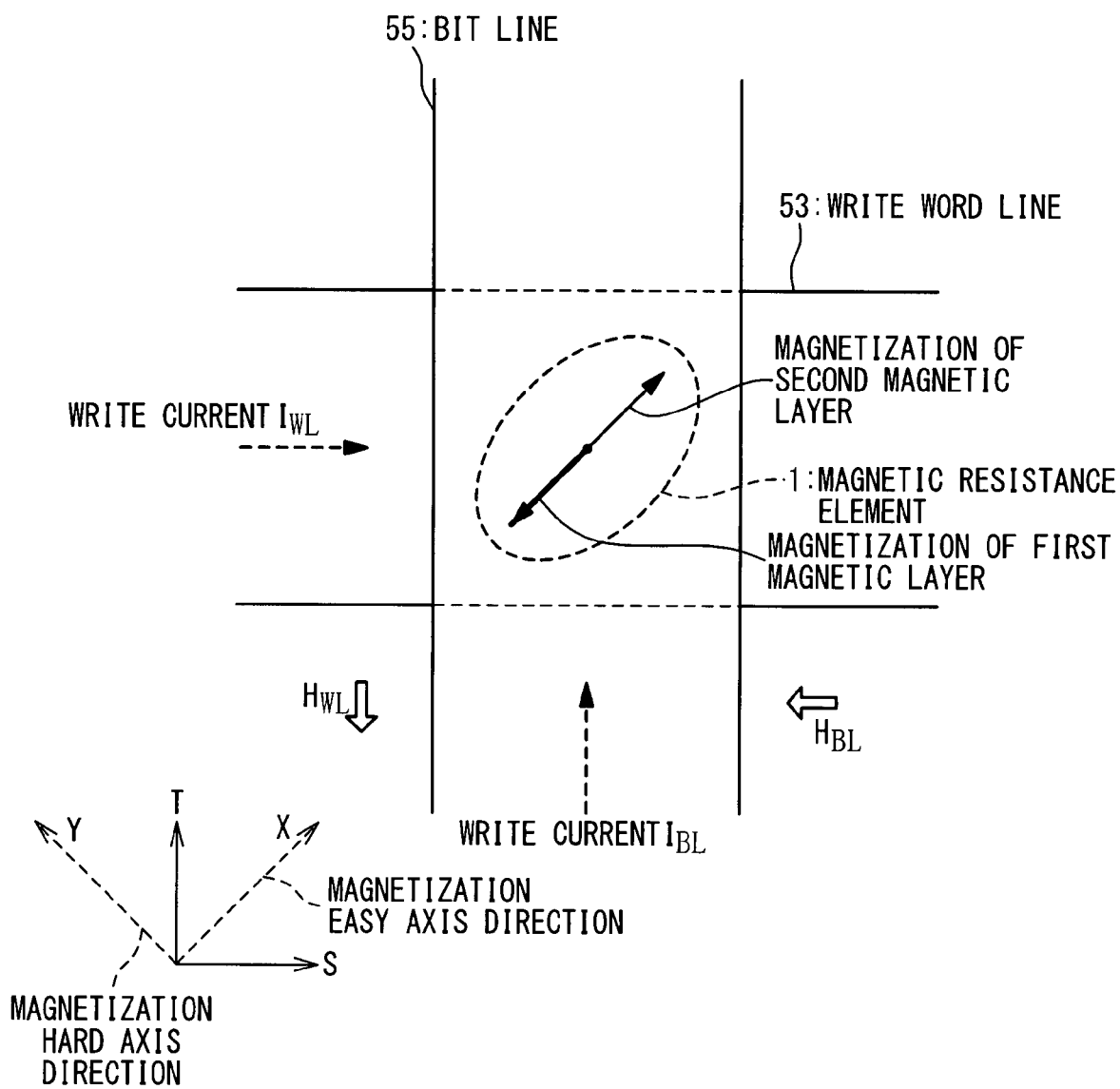

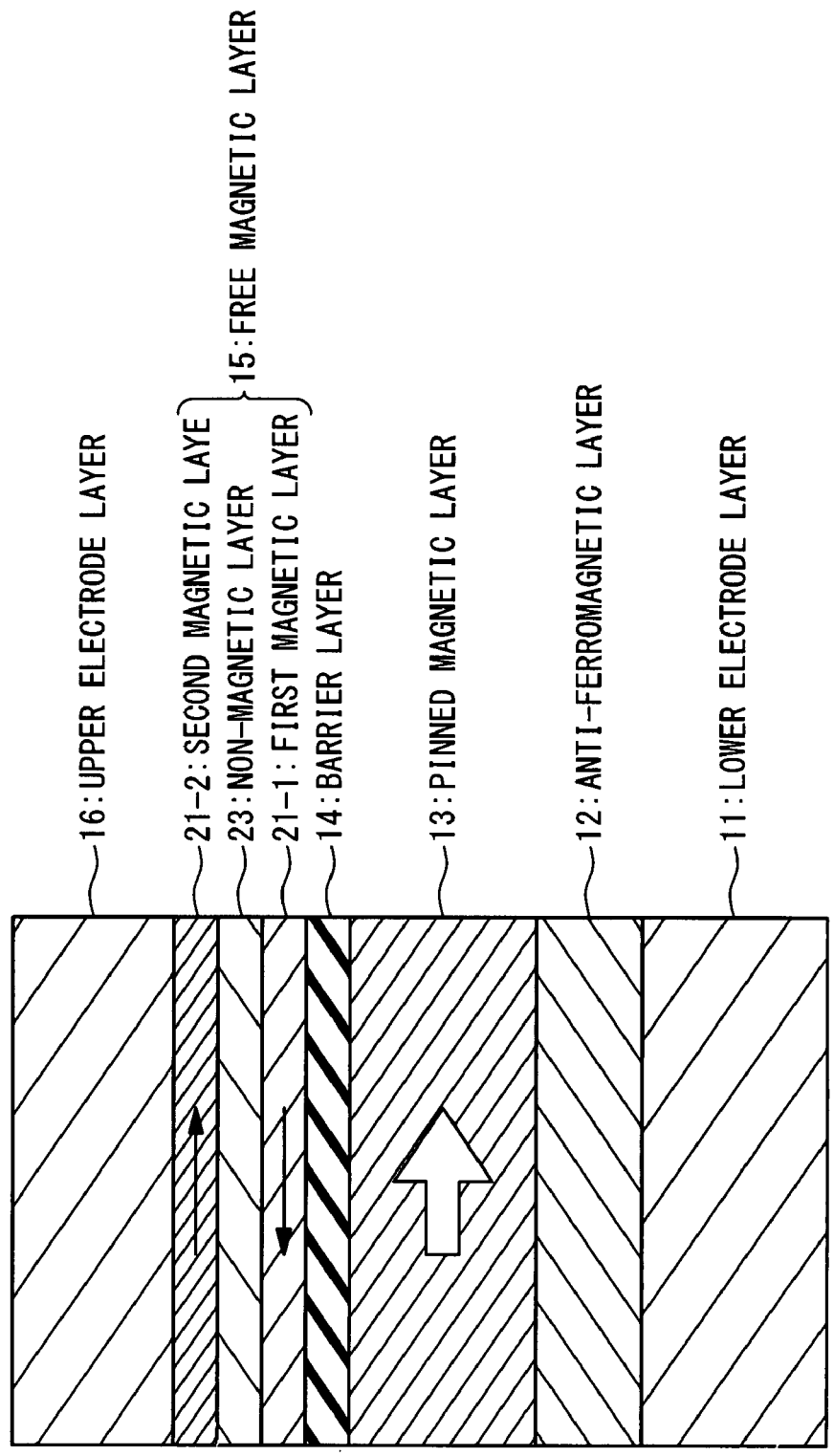

Fig. 18

| SYSTEM \ | READ BEFORE WRITE | WRITE OPERATION | WRITE SYSTEM |
|---|---|---|---|
| TOGGLE | YES | WRITE WHEN CURRENT STATE AND WRITE STATE ARE DIFFERENT | ONLY, $+I_{WL}$ AND $+I_{BL}$ (OK IN CASE OF ONLY $-I_{WL}$ AND $-I_{BL}$) |
| DIRECT | NO | WRITE IN ALL CASES | $+I_{WL}$ AND $+I_{BL}$ IN CASE OF WRITE OF "1" AND $-I_{WL}$ AND $-I_{BL}$ IN CASE OF WRITE OF "0" |
| INVENTION | YES | WRITE WHEN CURRENT STATE AND WRITE STATE ARE DIFFERENT | $+I_{WL}$ AND $+I_{BL}$ IN CASE OF WRITE OF "1" AND $-I_{WL}$ AND $-I_{BL}$ IN CASE OF WRITE OF "0" |

Fig. 19
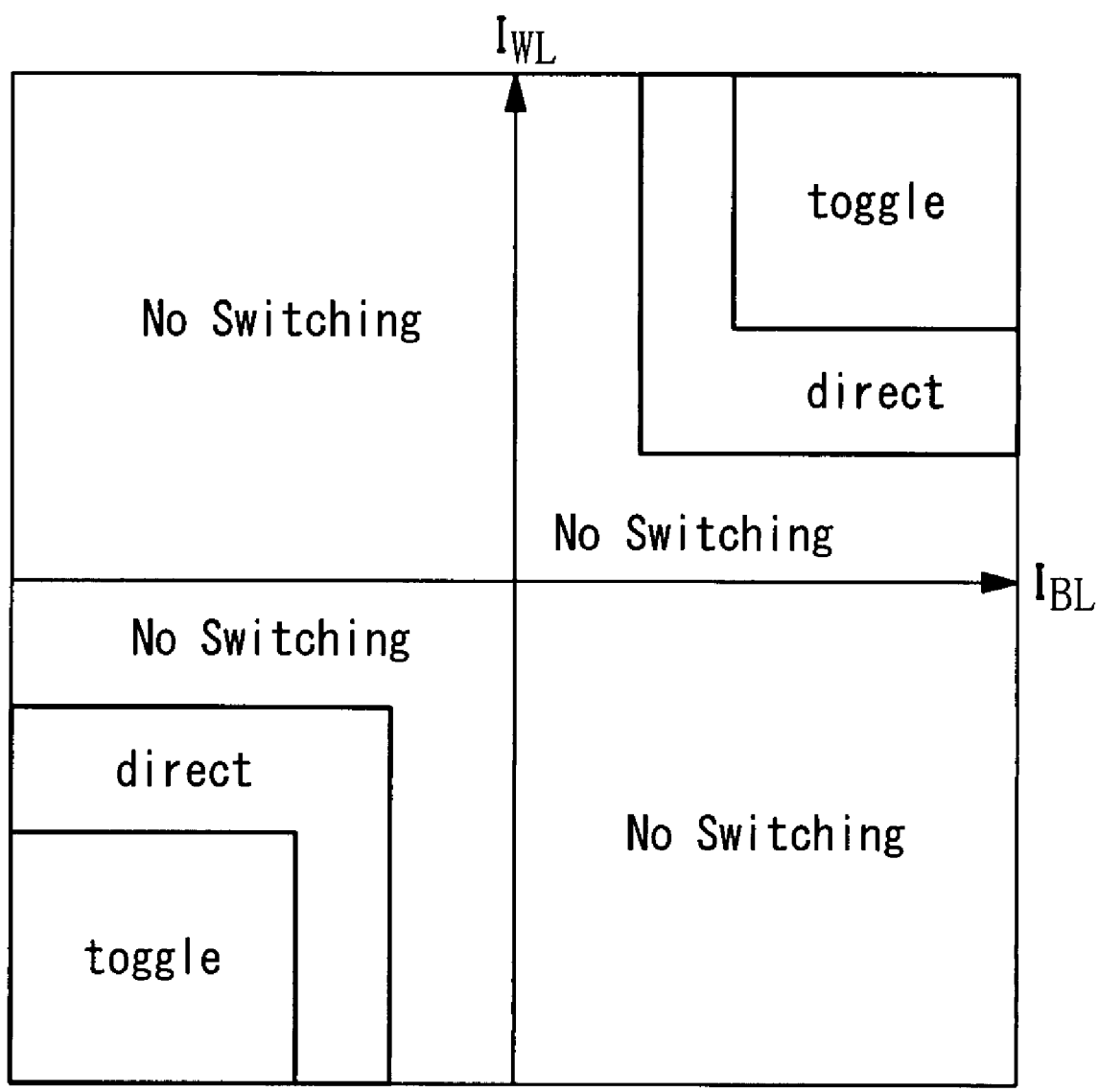

Fig. 20
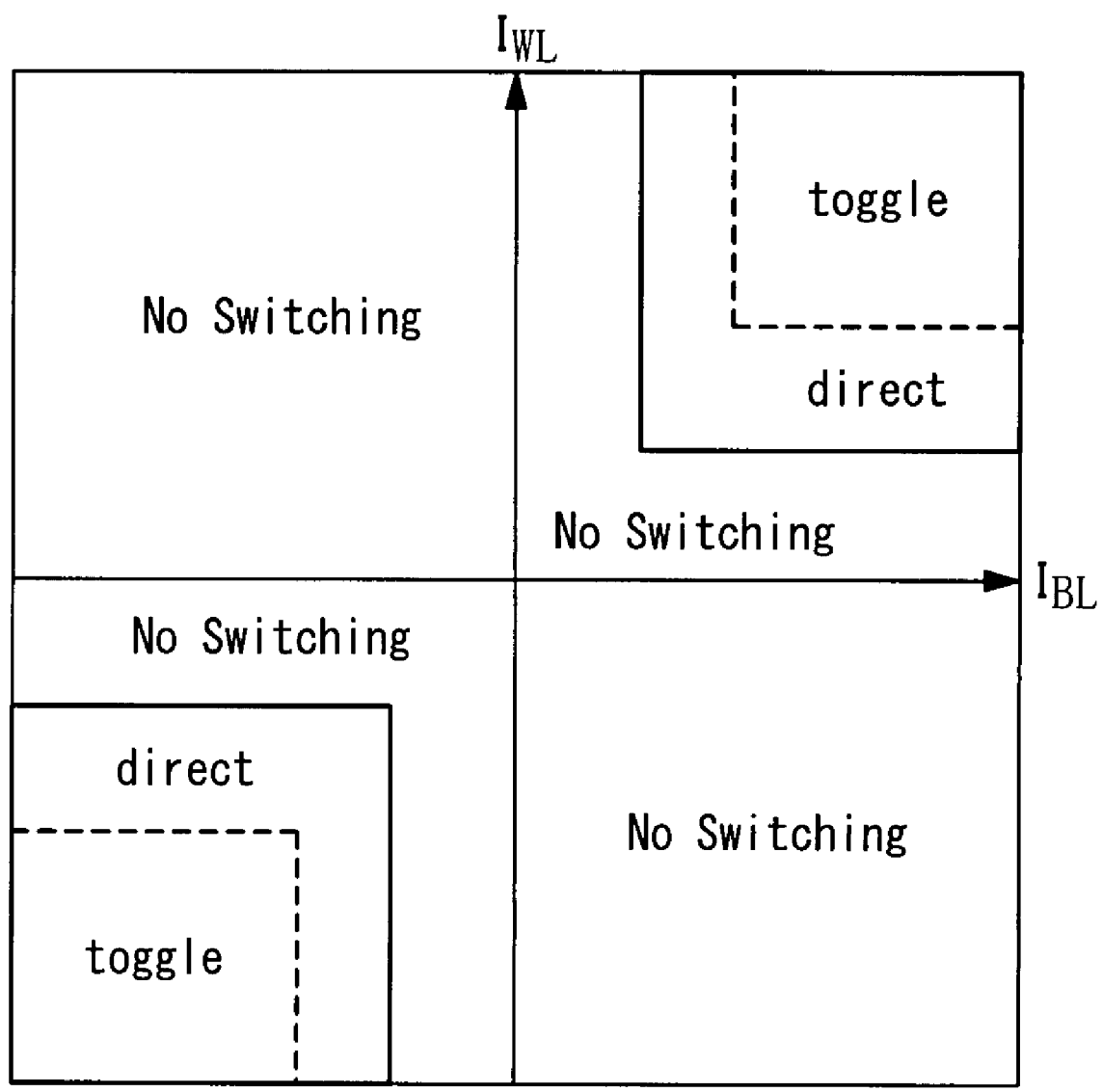

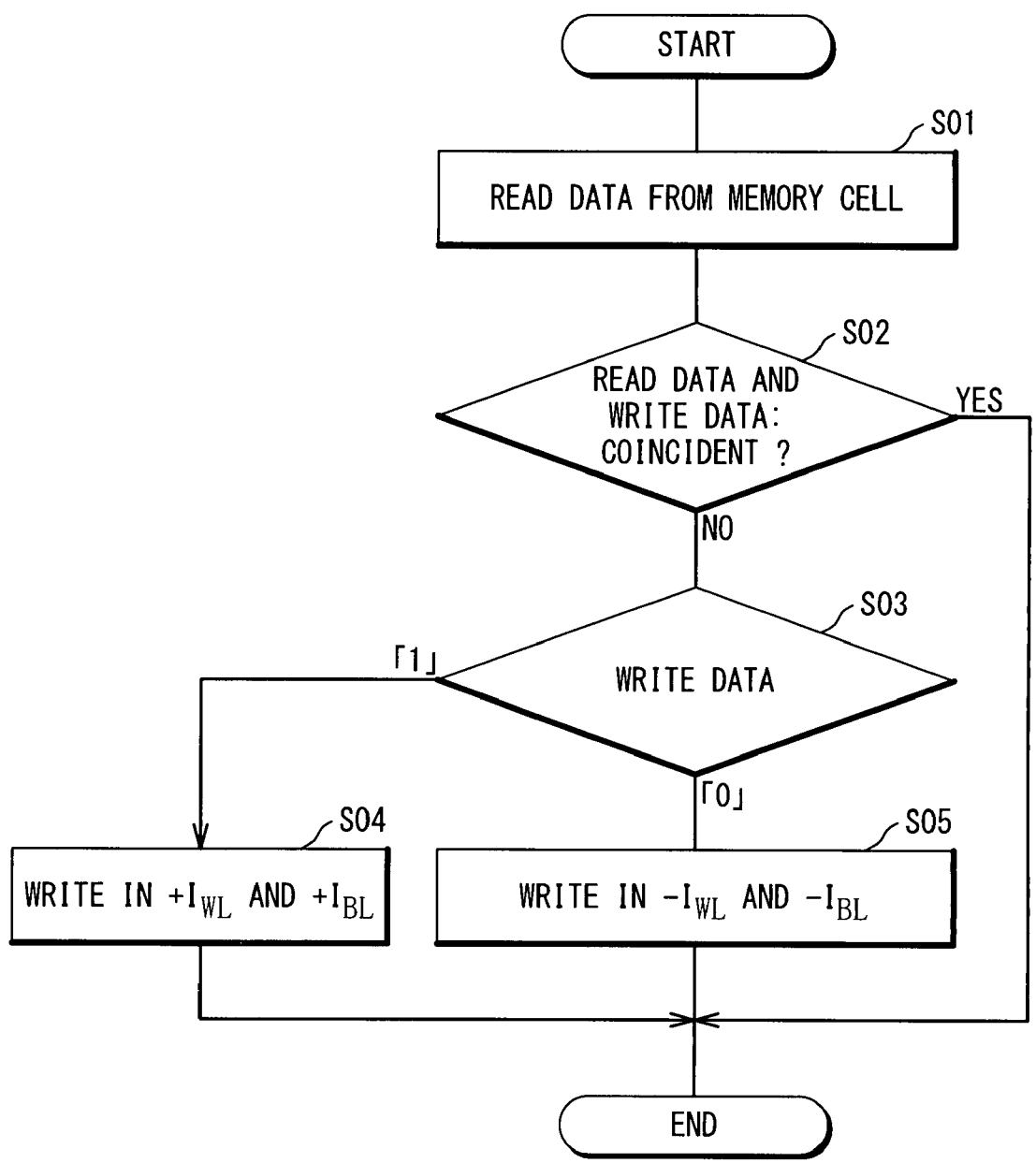
Fig. 21

Fig. 22
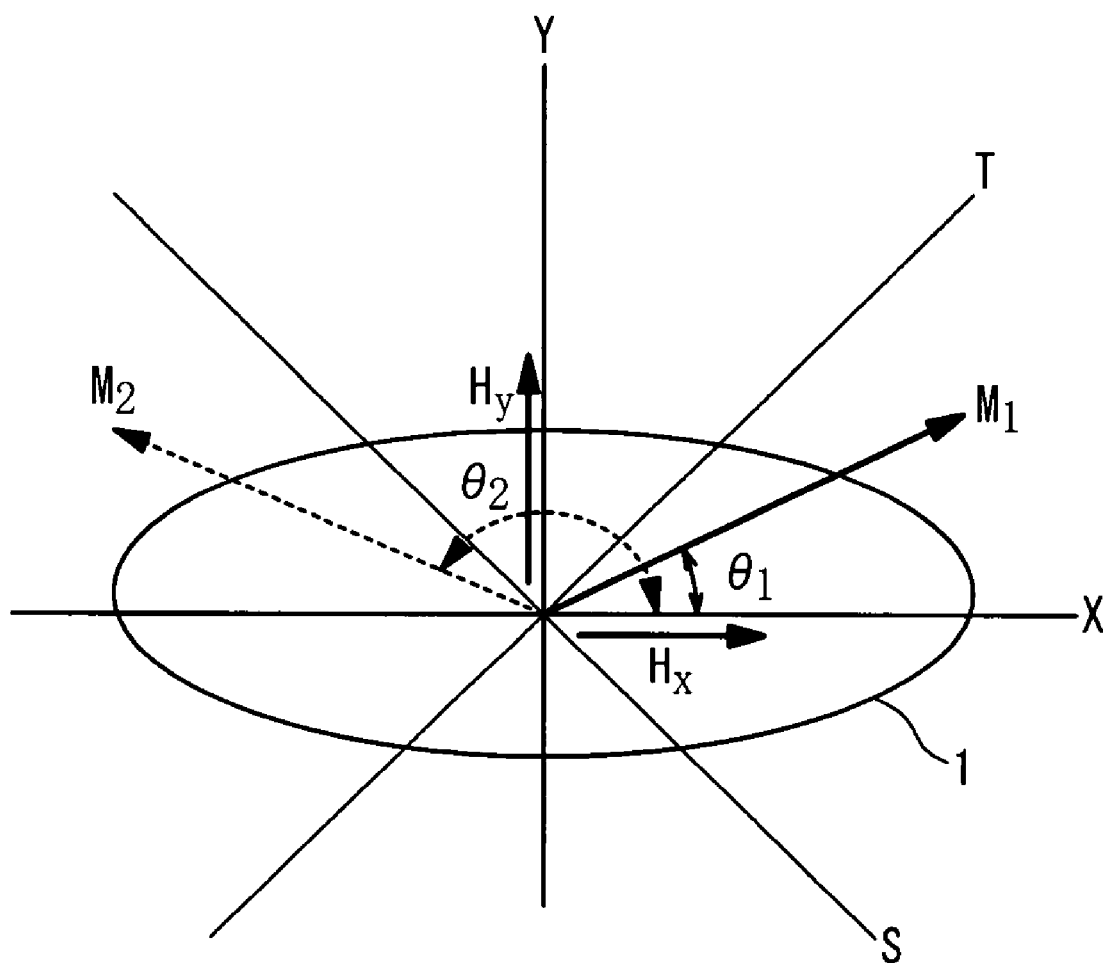

Fig. 23
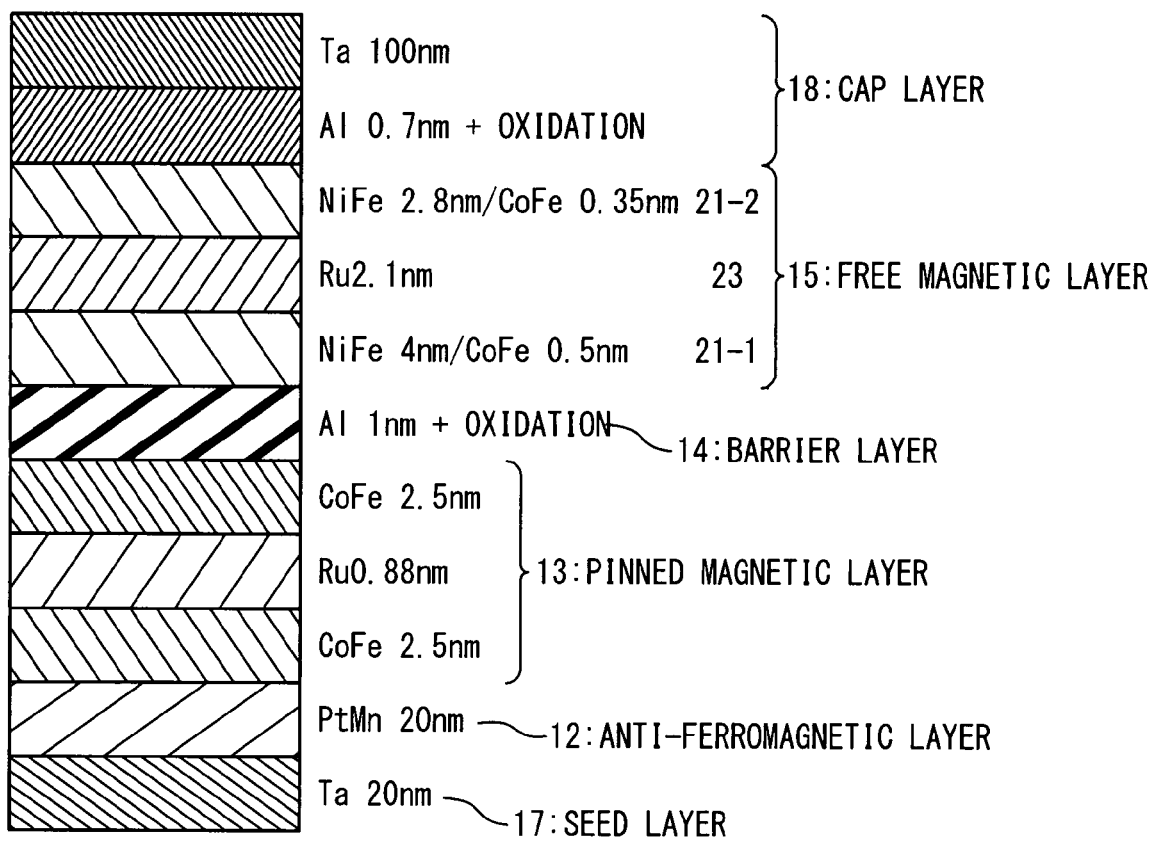

Fig. 24
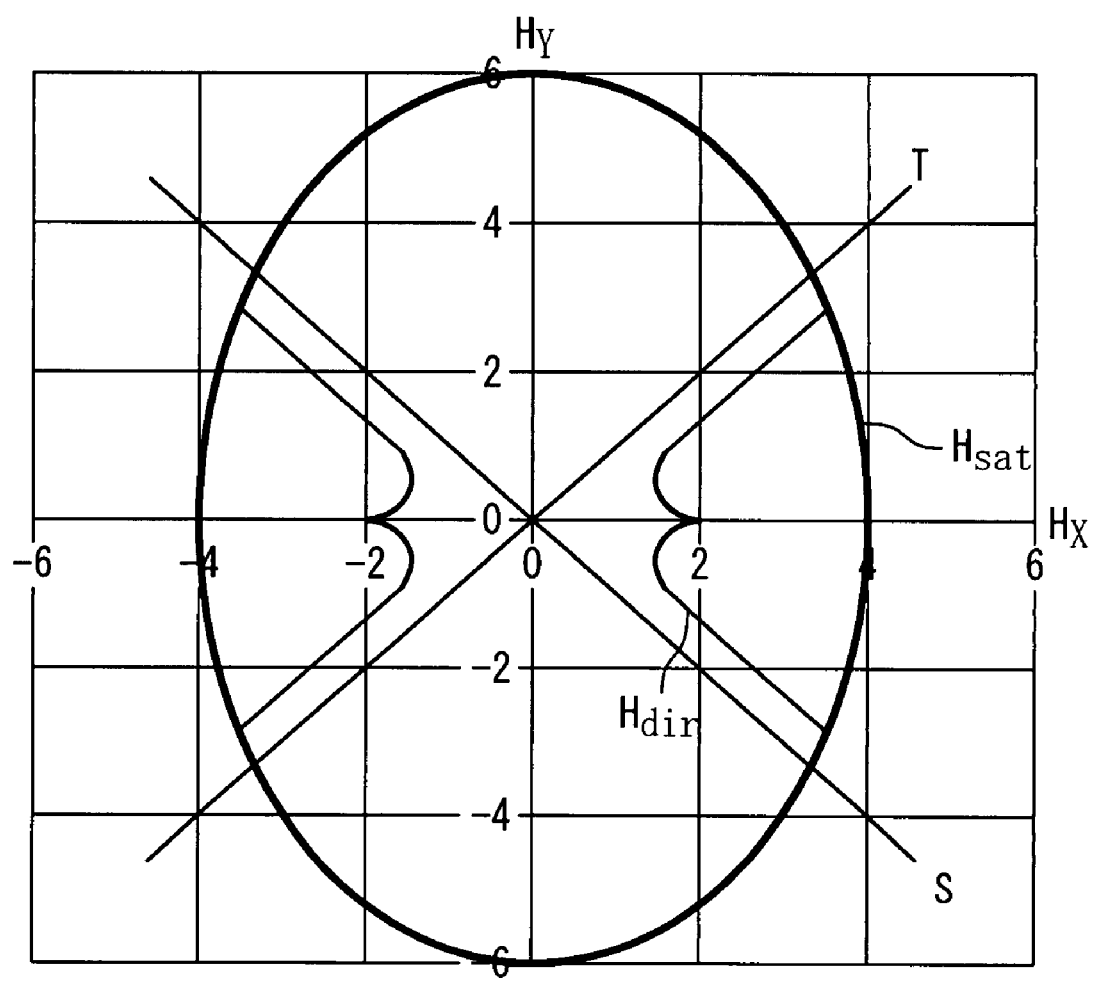

Fig. 25
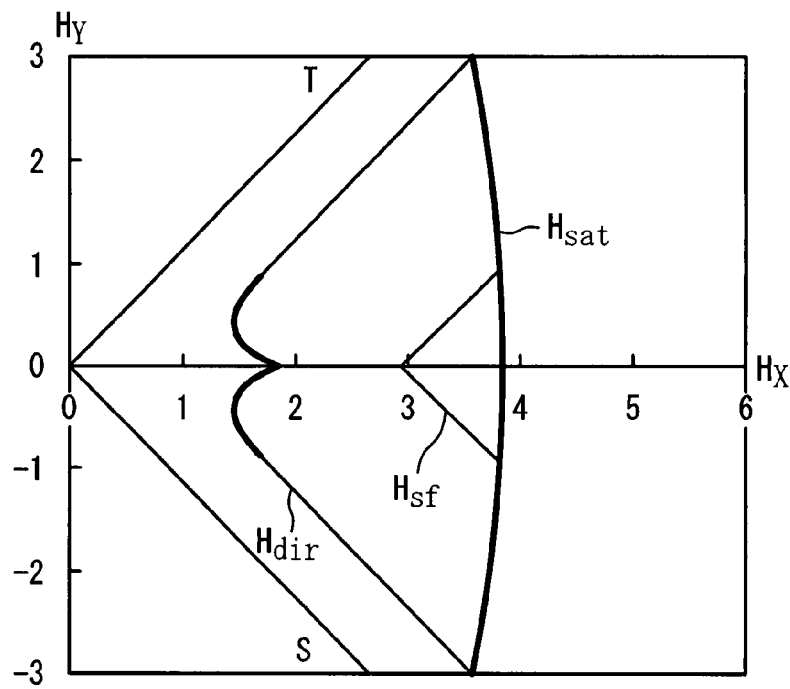
Fig. 26
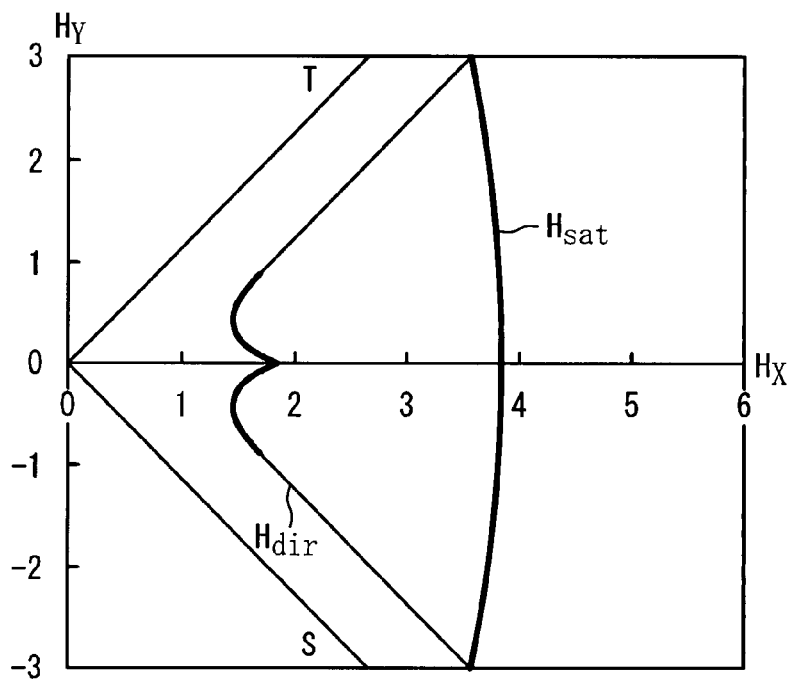

Fig. 27
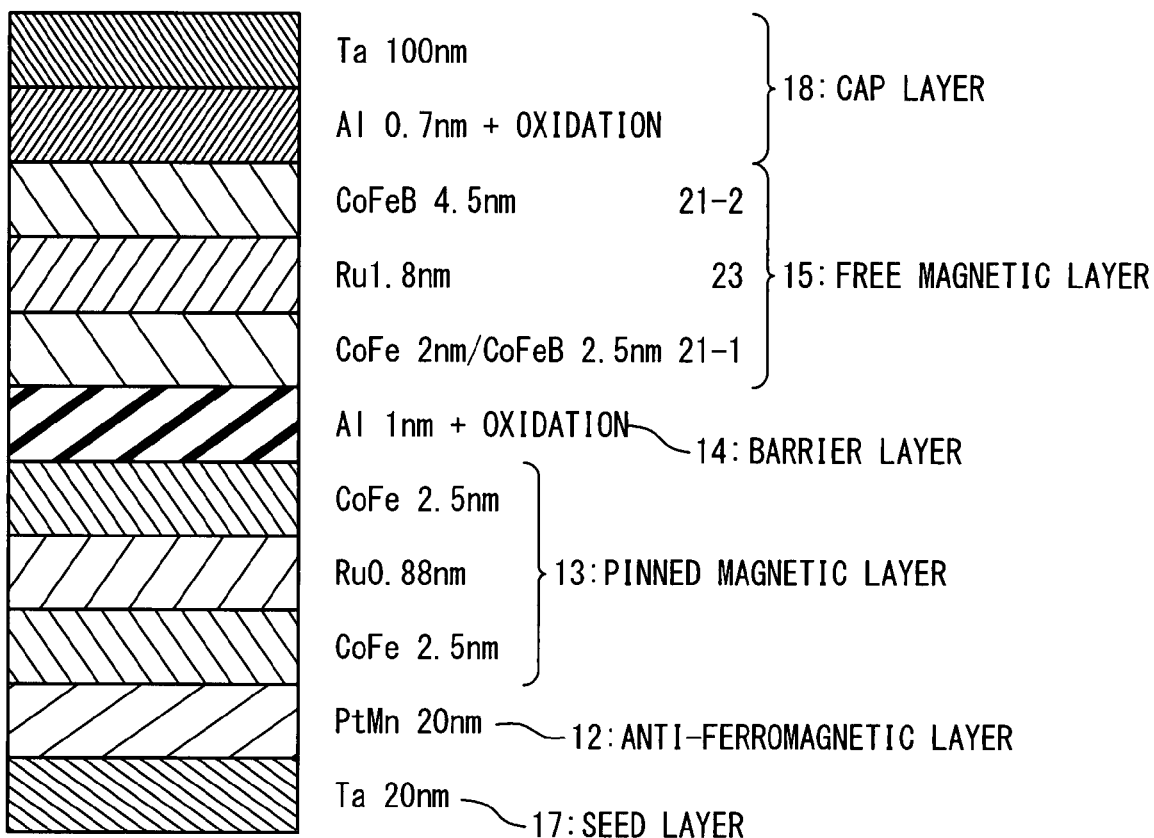

Fig.28
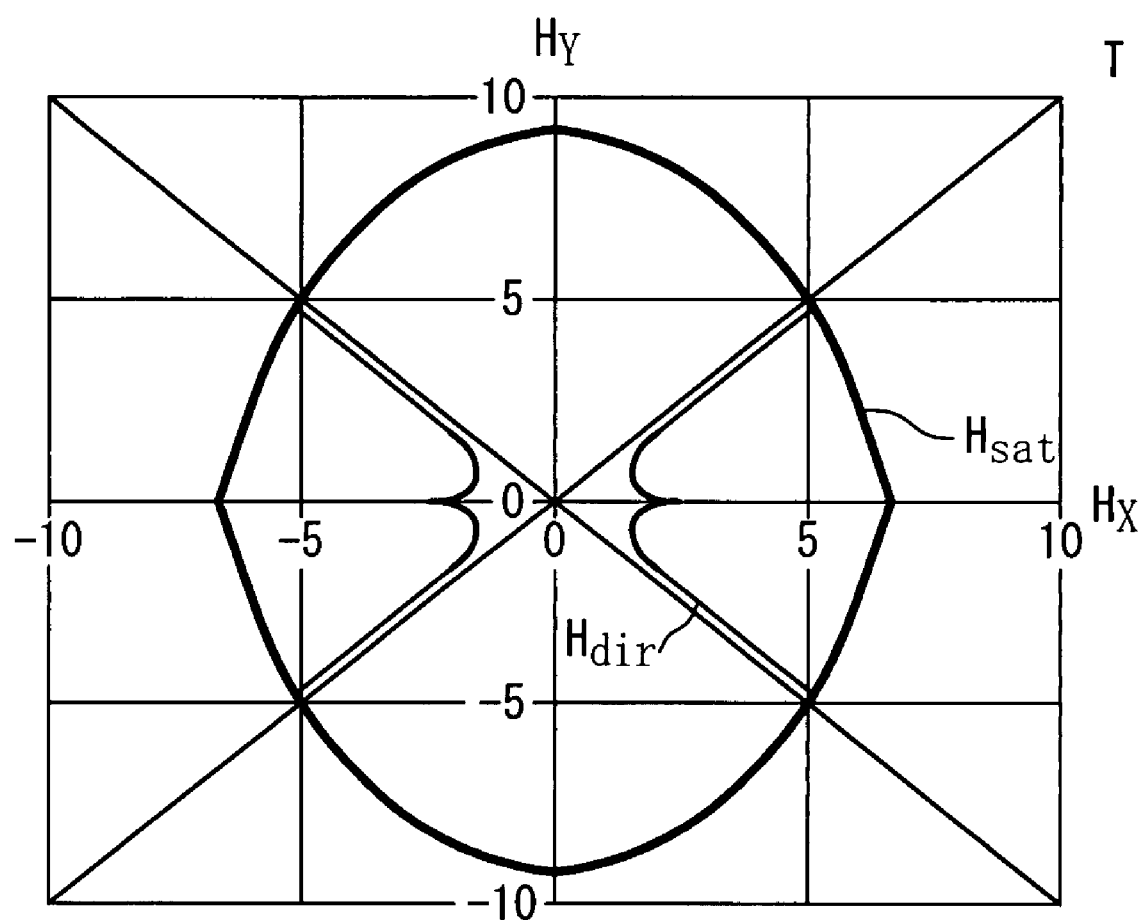

Fig. 29
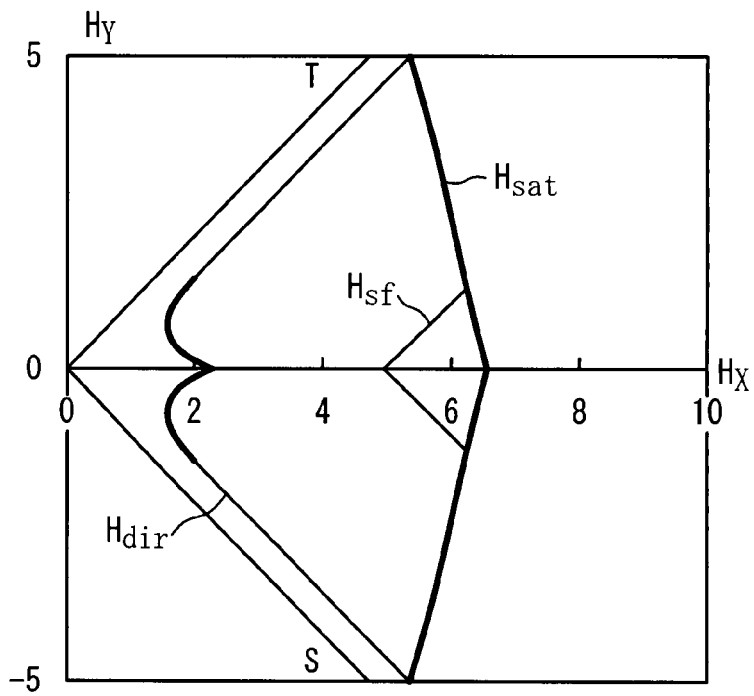
Fig. 30
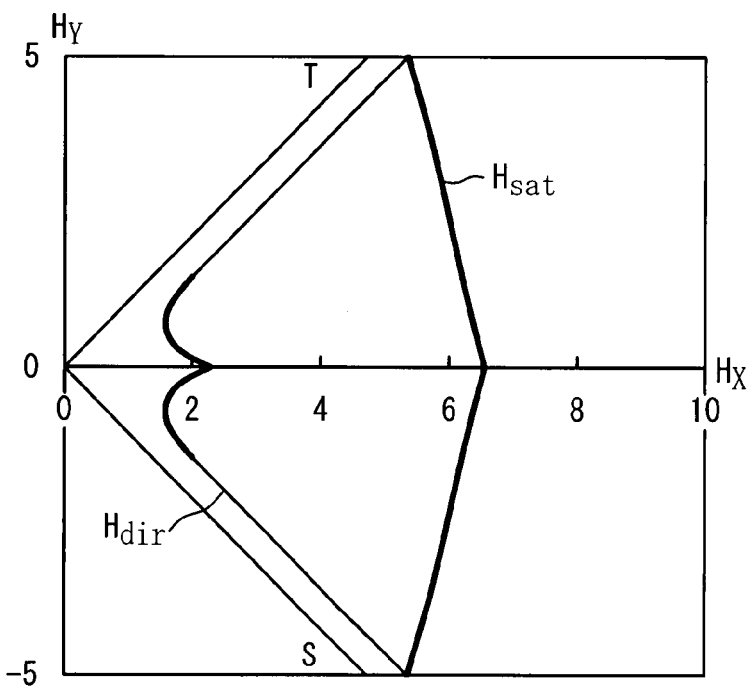

Fig. 31
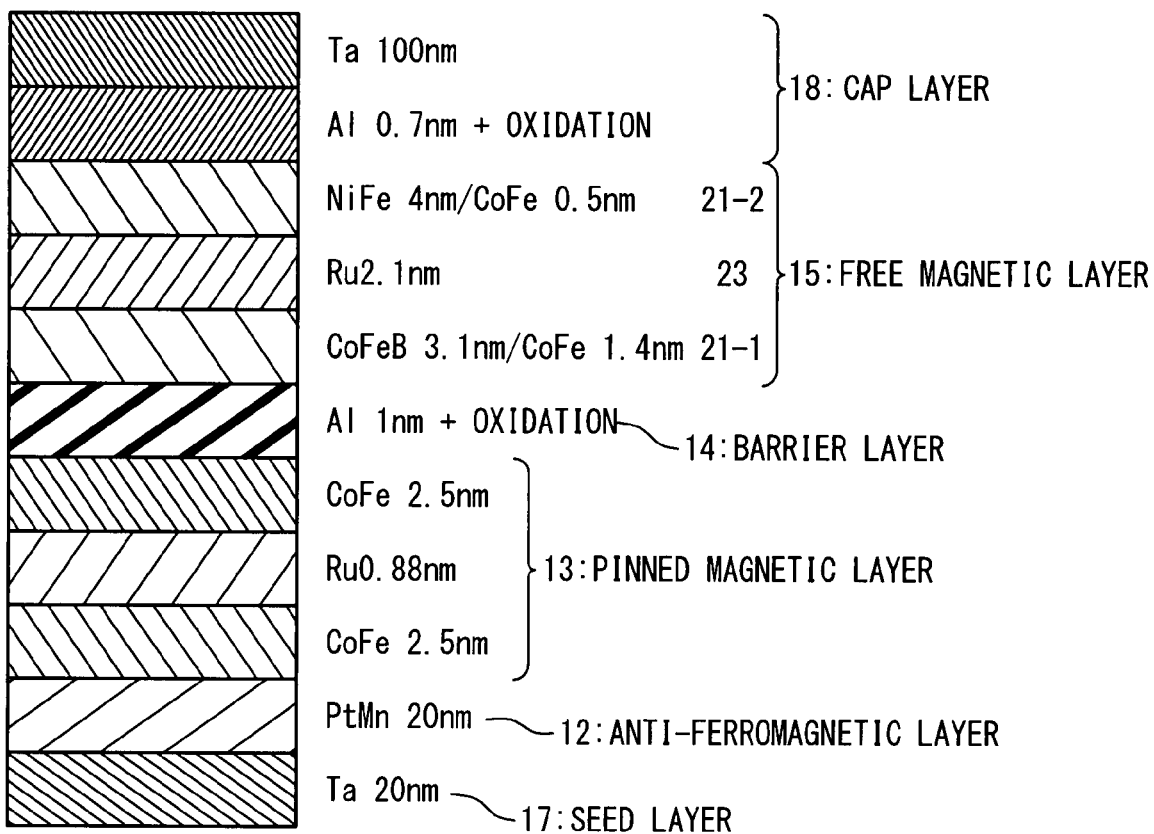

Fig. 32
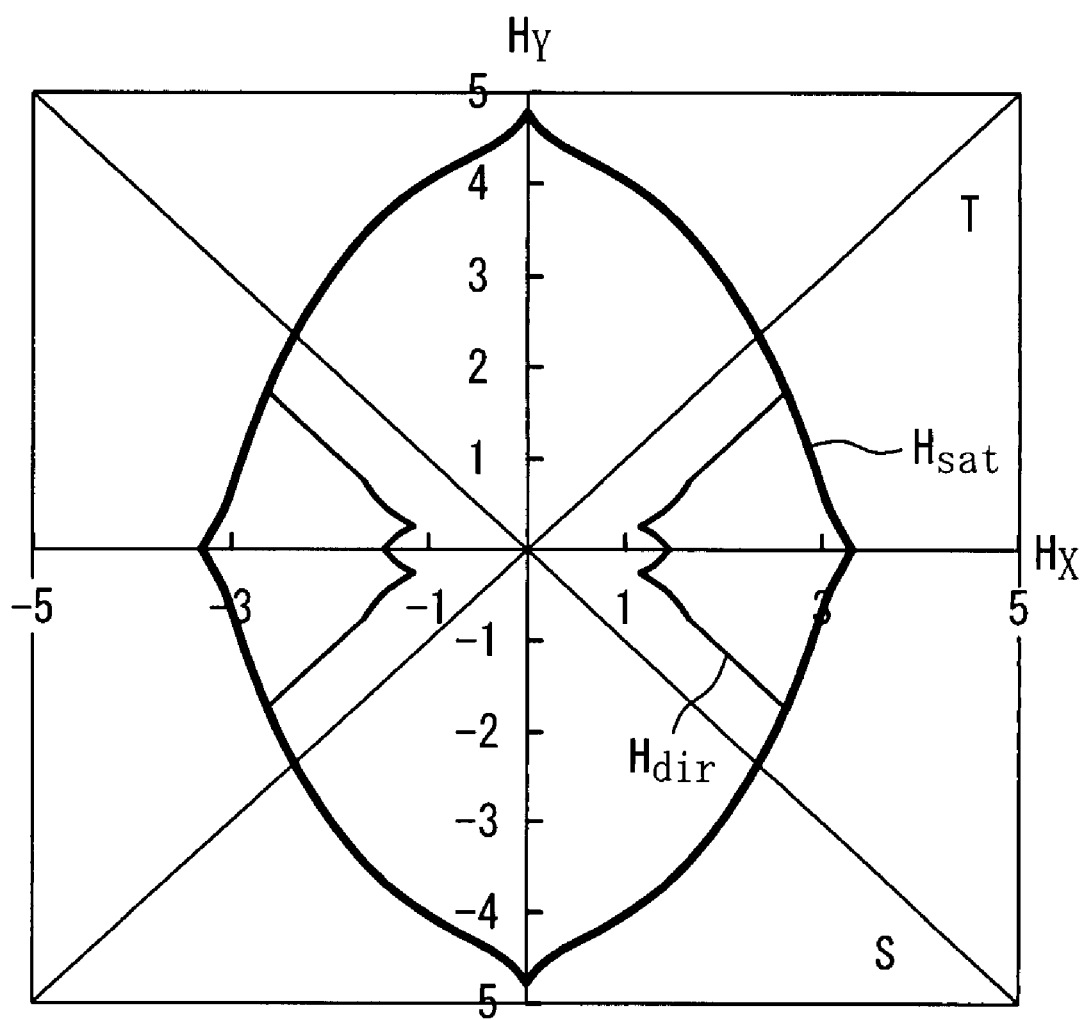

Fig. 33
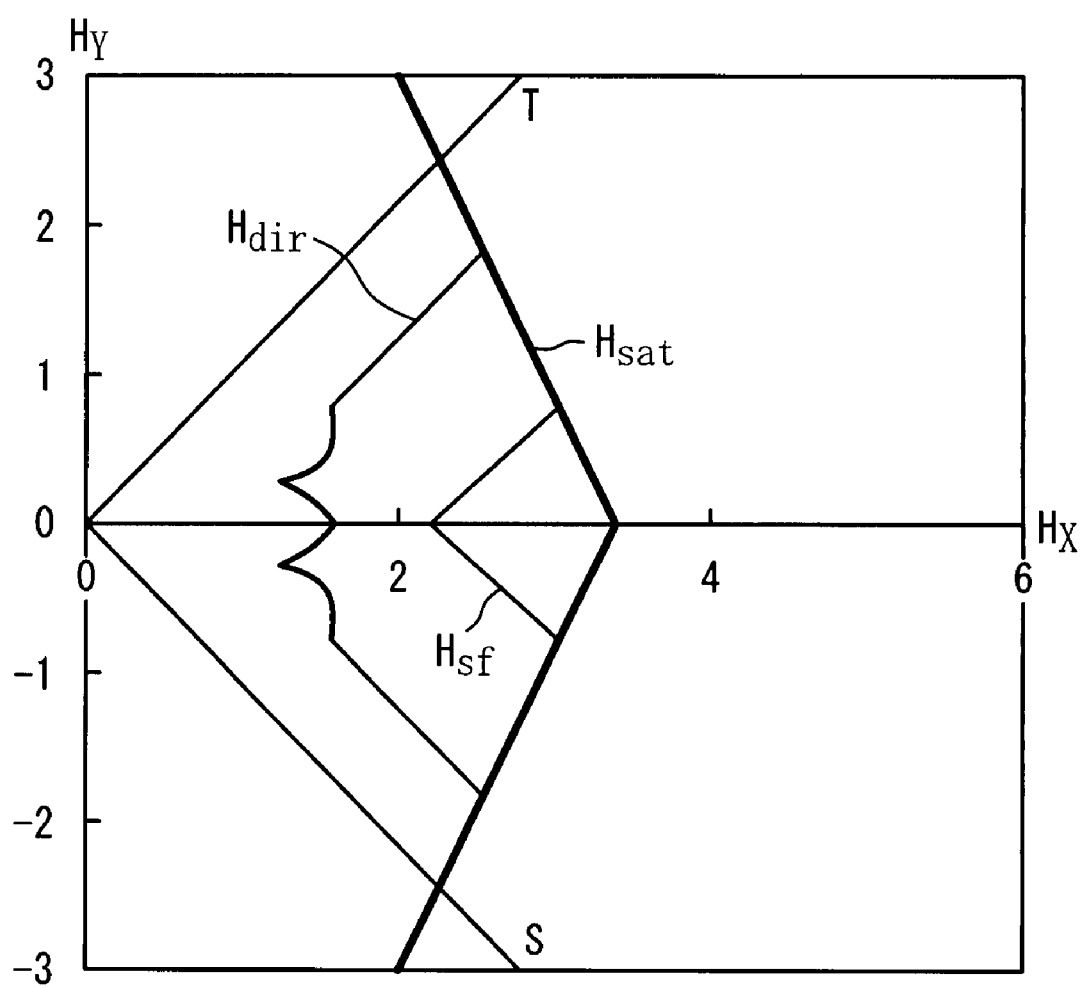

Fig. 34
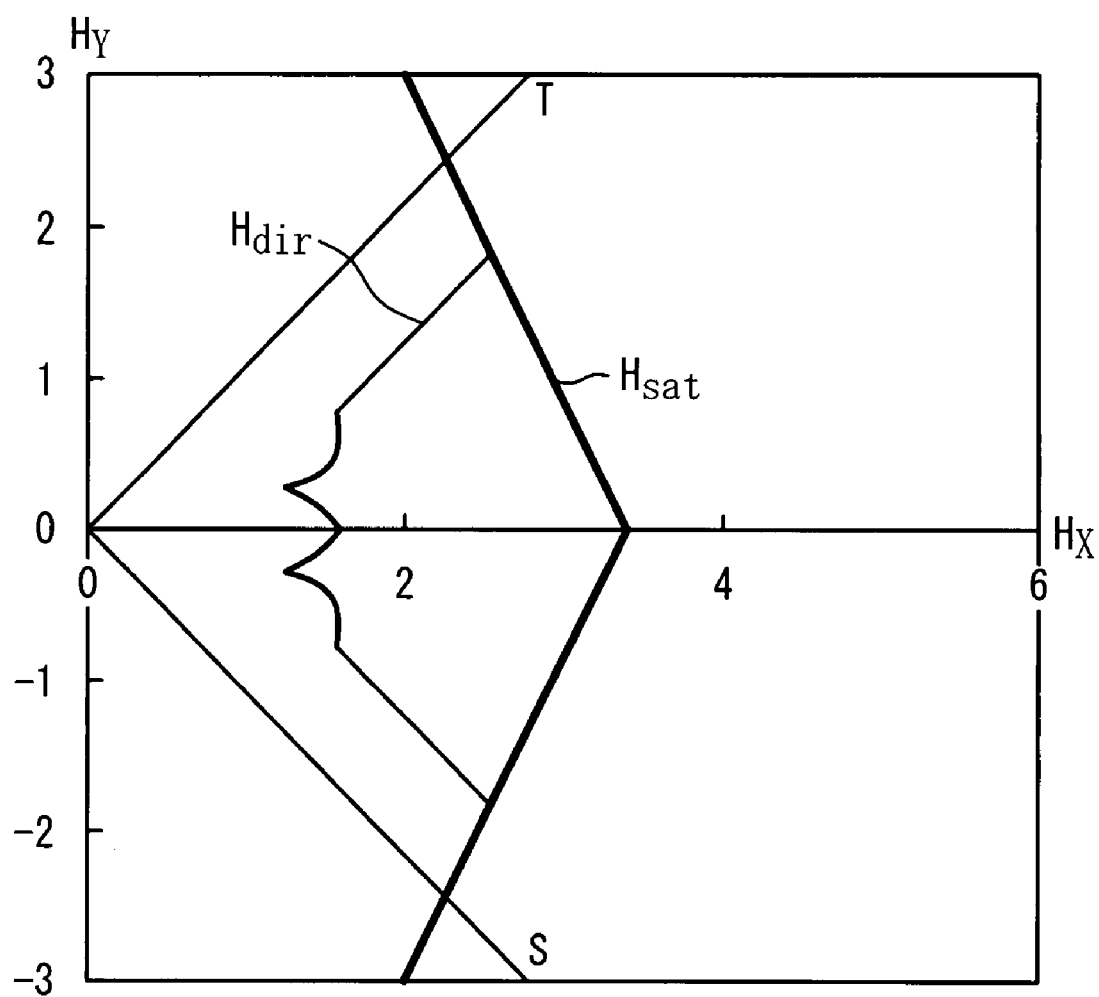

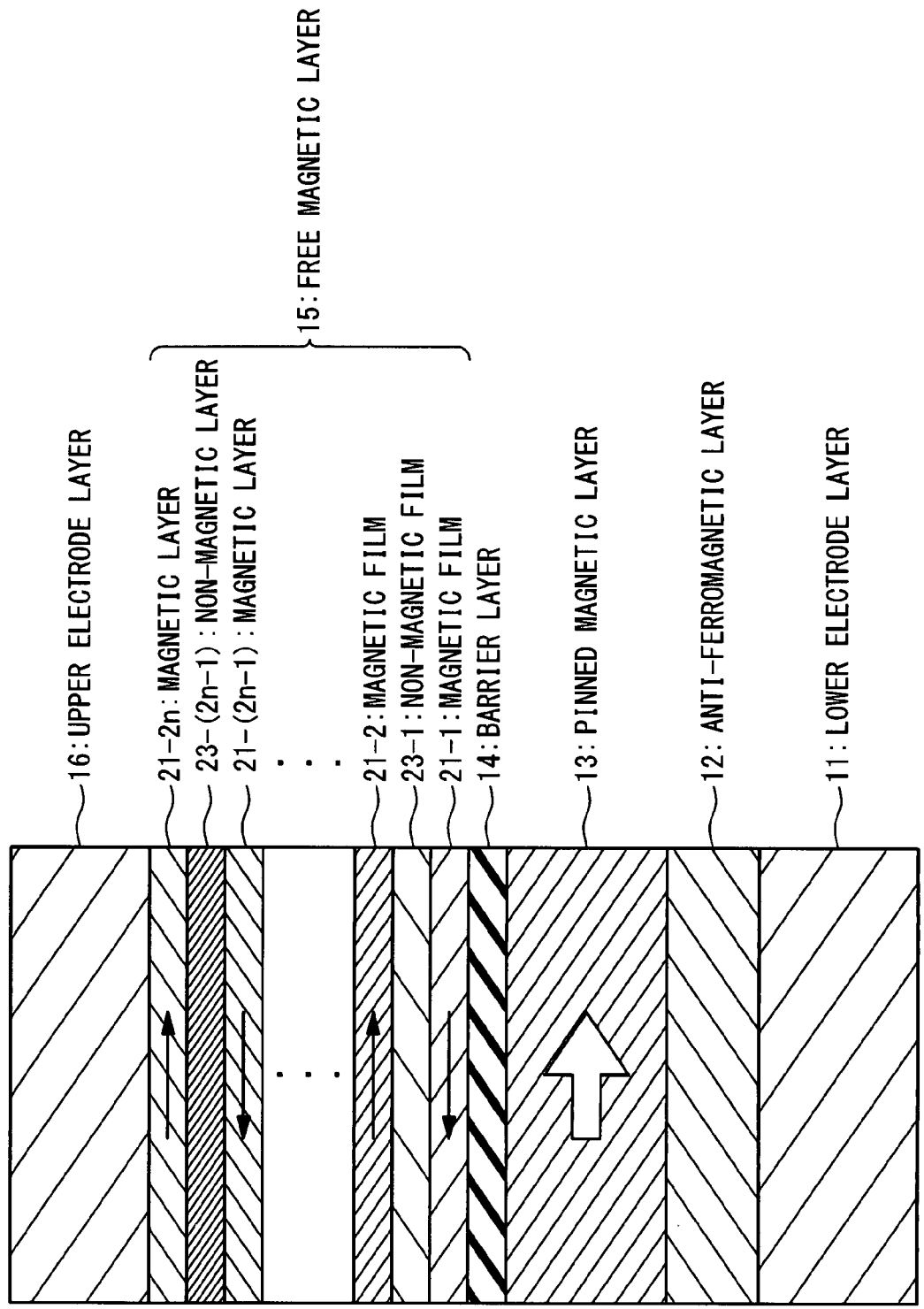
Fig. 35

MAGNETIC RANDOM ACCESS MEMORY

TECHNICAL FIELD

The present invention relates to a magnetic random access memory (MRAM), and more particularly relates to a magnetic random access memory having a lamination ferry structure.

BACKGROUND ART

The magnetic random access memory (MRAM) is a hopeful non-volatile memory from the viewpoint of high integration and high speed operation. In the MRAM, a magnetic resistance element is used which shows a magnetic resistance effect such as an AMR (Anisotropic Magneto Resistance) effect, a GMR (Giant Magneto Resistance) effect and a TMR (Tunnel Magneto Resistance) effect.

U.S. Pat. No. 5,640,343 discloses a typical MRAM. In this MRAM, in such a way that an erroneous write (write disturbance) to a half-selection cell does not occur at a time of a write operation, the value of a write current is limited to a predetermined write margin. However, in the magnetic resistance element of each memory cell in the MRAM, a variation exists in its characteristic. As the variation in the characteristic of the magnetic resistance element becomes greater, the write margin becomes smaller. As a result, the possibility of the write disturbance becomes higher.

As a technique for suppressing the erroneous write, a synthetic anti-ferromagnetic layer material (SAF) is proposed. For example, U.S. Pat. No. 6,545,906 discloses the MRAM having the SAF structure. The MRAM having the SAF structure uses the magnetic film of N layers (N is an integer of 2 or more) that are coupled to each other in an anti-ferromagnetic manner. U.S. Pat. No. 6,545,906 discloses the cases of N=2 and N=3.

FIGS. 1 and 2 are conceptual views showing the SAF structure of the magnetic resistance element in the MRAM in the related art. This magnetic resistance element 101 includes a lower electrode layer 111, an anti-ferromagnetic layer 112, a fixed magnetic layer (pin layer) 113, a barrier layer 114, a free magnetic layer (free layer) 115 and an upper electrode layer 116. The free magnetic layer 115 includes a first magnetic film 121 and a second magnetic film 122, which are coupled through a thin non-magnetic film 123 in the anti-ferromagnetic manner (N=2). With this anti-ferromagnetic coupling, as indicated by the arrows in FIGS. 1 and 2, the orientations of the spontaneous magnetizations of the first magnetic film 121 and the second magnetic film 122 are oppositely parallel in a stable state. The orientations of the spontaneous magnetizations of first magnetic film 121 and the second magnetic film 122 in the free magnetic layer (free layer) 115 can be inverted. When one of the spontaneous magnetizations is inverted, the other spontaneous magnetization is also inverted such that the oppositely parallel state is kept.

The first magnetic film 121 in the free magnetic layer 115 is laminated through the barrier layer 114 on the fixed magnetic layer 113. FIG. 1 shows [First State] in which the orientation of the spontaneous magnetization of the first magnetic film 121 and the orientation of the spontaneous magnetization of the fixed magnetic layer 113 are [oppositely Parallel], and FIG. 2 shows [Second State] in which the orientation of the spontaneous magnetization of the first magnetic film 121 and the orientation of the spontaneous magnetization of the fixed magnetic layer 113 are [Parallel]. With the magnetic resistance effect, a resistance value (R+ΔR) of the magnetic resistance element 101 in the first state is greater than a resistance value (R) in the second state. In the MRAM employing the SAF structure, this magnetic resistance element 101 is used as the memory cell, and the change in the resistance value is used, and a data is consequently stored in a non-volatile manner. For example, the first state shown in FIG. 1 is related to a data [1], and the second state shown in FIG. 2 is related to a data [0].

FIG. 3 is a plan view showing the orientation of the spontaneous magnetization in the MRAM of the SAF structure. A write word line 153 and a bit line 155 are formed along an S-direction and a T-direction, which are orthogonal to each other. A write current $I_{WL}$ flows through the write word line 153, and a write current $I_{BL}$ flows through the bit line 155. The memory cell (magnetic resistance element 101) is arranged and sandwiched between the write word line 153 and the bit line 155. Here, [Magnetization Easy Axis Direction] in the free magnetic layer 115 in the magnetic resistance element 101 is assumed to be an X-direction, and [Magnetization Hard Axis Direction] is assumed to be a Y-direction. In the MRAM of the SAF structure, the memory cell is arranged such that the magnetization easy axis direction (the X-direction) has the angle of 45 degrees with respect to the S-direction or T-direction. In the stable state, the spontaneous magnetization (the thick arrow mark) of the first magnetic film 121 and the spontaneous magnetization (the thin arrow mark) of the second magnetic film 122 are oppositely paralleled to each other and oriented to the magnetization easy axis direction.

In the MRAM using the SAF structure of U.S. Pat. No. 6,545,906, the write is performed in accordance with the two methods of [Direct Writing Method] and [Toggle Writing Method].

[Toggle Writing Method] is used when in the first magnetic film 121 and the second magnetic film 122, their spontaneous magnetizations Ms, film thicknesses t and one-axis anisotropic magnetic fields Hk are approximately equal. That is, the product $Ms_1 \times t_1$ of a spontaneous magnetization $Ms_1$ and a film thickness $t_1$ of the first magnetic film 121 and the product $Ms_2 \times t_2$ of a spontaneous magnetization $Ms_2$ and a film thickness $t_2$ of the second magnetic film 122 have the following relation.

$$Ms_1 \times t_1 \approx Ms_2 \times t_2$$

FIGS. 4A and 4B are timing charts showing the write operation in the MRAM employing the toggle writing method. At first, at a time t1, the write current $I_{WL}$ is supplied to the write word line 153, and at a time t2, the write current $I_{BL}$ is supplied to the bit line 155. In succession, at a time t3, the supply of the write current $I_{WL}$ is stopped, and at a time t4, the supply of the write current $I_{BL}$ is stopped. Such execution of a current control inverts the orientations of the spontaneous magnetizations in the first magnetic film 121 and the second magnetic film 122. In short, according to the toggle writing method, the magnetization state of the free magnetic layer 115 is changed such as a toggle switch between [First State] and [Second State] for each write operation.

As mentioned above, in the MRAM employing a toggle writing method, the state is changed for each write operation. Thus, before the data is written, the data (storage data) stored in the target memory cell is read. Only when the storage data and the write data are different, the write operation is executed.

FIG. 5 is a view showing a threshold property in the MRAM employing the toggle writing method. In FIG. 5, the vertical axis and the horizontal axis indicate the write currents $I_{WL}, I_{BL}$, respectively. The write currents $I_{WL}, I_{BL}$ corresponding to the regions (toggle operation regions) represented as [toggle] on the drawing are supplied to the write word line 153 and the bit line 155, which correspond to [Selection Cell] to which the data are written. Consequently, the toggling operation is performed on the selection cell. Here, this toggling operation region does not have an X-intercept and a Y-intercept. Thus, only the magnetic field resulting from any of the write currents is applied to [Half-Selection Cell] in which any one of the write word line 153 and the bit line 155 is common to the selection cell. Thus, the toggling operation is not performed on the half-selection cell. In this way, according to the MRAM employing the toggle writing method, the erroneous write is greatly reduced, as compared with the typical MRAM described in U.S. Pat. No. 5,640,343. Also, the value of the write current is not required to be strictly controlled. Hence, the write margin is dramatically improved.

The operation region of the MRAM in the toggle writing method is defined as follows. FIG. 6 is a graph showing a threshold property of the MRAM employing the toggle writing method in detail. The vertical axis and the horizontal axis indicate a word line vertical magnetic field $H_{WL}$ and a bit line vertical magnetic field $H_{BL}$, which are generated by the write currents $I_{WL}$, $I_{BL}$, respectively. FIG. 7 is a graph showing the magnetic resistance characteristic of the free magnetic layer 115 of the MRAM employing the toggle writing method. The horizontal axis indicates a magnetic field $H_X$ of the magnetization easy axis (X) direction, and the vertical axis indicates the resistance value.

The magnetic field in the magnetization easy axis (X) direction, which is the minimal magnetic field necessary for the toggling operation, is defined as [Flop Field (Spin Flop Field) $H_{Sf}$]. That is, the magnitude of the flop field $H_{Sf}$ is defined as the distance between an original point and a point a in FIG. 6. When the free magnetic layer 115 is constituted by equivalent magnetic films of two layers, the flop field $H_{Sf}$ is represented by the following equation by using [One-Axis Anisotropic Magnetic Field $H_K$] and [Anti-Ferromagnetic Coupling Magnetic Field $H_I$]

$$H_{Sf} = \{H_K(H_K + H_I)\}^{1/2}$$

Also, when the magnetic field at the time of the write operation exceeds a certain value, the spontaneous magnetizations of the respective magnetic fields included in the free magnetic layer 115 are oriented in the perfectly same direction. At this time, the operation becomes unstable. The magnetic field at the limit at which it is not unstable is indicated by a curve c in FIG. 6. The magnetic field in the magnetization easy axis (X) direction, which is the magnetic field of the limit, is defined as [Saturation Field] $H_{Sat}$. That is, the magnitude of the saturation field $H_{Sat}$ is defined as the distance between the original point and a curve c in FIG. 6.

In this way, the upper limit and lower limit of the toggling operation region are determined by the flop field $H_{Sf}$ and the saturation field $H_{Sat}$, respectively. The magnetic field $H_x$ in the magnetization easy axis direction applied at the time of the write operation is required to belong to the range between the flop field $H_{Sf}$ and the saturation field $H_{Sat}$, as shown in FIG. 7. In the MRAM employing the toggle writing method, a technique that can further enlarge this toggling operation region is desired.

Also, in the MRAM employing the toggle writing method, a technique that can reduce the electric power consumption is desired. This is because the write current resulting from the MRAM employing the toggle writing method tends to be greater than the write current resulting from the typical MRAM. As one example, the flop field $H_{Sf}$ for the free magnetic layer 115 constituted by the magnetic films of the two layers shown in FIG. 1 and the write magnetic field for the free magnetic layer 115 of a single layer which does not have the second magnetic film 122 and the magnetic film 123 are compared. In both of the free magnetic layers, the one-axis anisotropic fields $H_K$ are assumed to be equal. The write magnetic field to the free magnetic layer 115 of the single layer is about $H_K$. On the other hand, when the anti-ferromagnetic coupling magnetic field HI is given by $H_I = 4H_K$, the flop field $H_{Sf}$ is given from the following equation:

$$H_{Sf} = \sqrt{5} H_k$$

In this way, the MRAM employing the toggle writing method requires the write magnetic field equal to about (a root of 5) times, namely, the write current, as compared with the MRAM having the typical single-layer free magnetic layer. Thus, in the MRAM employing the toggle writing method, a technique that can reduce the write current is desired. For this purpose, the flop field $H_{Sf}$ is desired to be small. However, in order to reserve the endurance (the thermal disturbance endurance) against the disturbance in the orientation of the spontaneous magnetization of the free magnetic layer 115, which is caused by the thermal disturbance, the one-axis anisotropic magnetic field $H_K$ cannot be excessively reduced.

On the other hand, [Direct Writing Method] is used in case that the first magnetic film 121 and the second magnetic film 122 are different from each other in the spontaneous magnetizations Ms, the film thicknesses t and the one-axis anisotropic magnetic fields $H_K$. Here, in order to simply describe, the product $Ms_1 \times t_1$ of the spontaneous magnetization and film thickness of the first magnetic film 121 and the product $Ms_2 \times t_2$ of the spontaneous magnetization and film thickness of the second magnetic film 122 have the following relation.

$$Ms_1 \times t_1 > Ms_2 \times t_2$$

FIGS. 8A and 8B and FIGS. 9A to 9E are views showing a [1] write operation of the MRAM employing the direct writing method. FIGS. 8A and 8B are the timing charts of the write current $I_{WL}$ and the write current $I_{BL}$. FIGS. 9A to 9E show the orientations of the spontaneous magnetizations of the first magnetic film 121 and the second magnetic film 122 at the respective times of the timing chart. Here, the [1] write implies the write of [1] to the memory cell (magnetic resistance element 101). Specifically, this indicates that the spontaneous magnetization of the first magnetic film 121 is oriented in the −X direction. A [0] write implies the write of [0] to the memory cell (magnetic resistance element 101). Specifically, this indicates that the spontaneous magnetization of the first magnetic film 121 is oriented in the +X direction.

FIGS. 8A and 8B and FIGS. 9A to 9E show the example in which the [1] write is performed on the magnetic resistance element 101 in the state ([0] state) that [0] has been written, and it is set at the state ([1] state) that [1] ha been written. In an initial state, the spontaneous magnetization of the first magnetic film 121 is assumed to be oriented in the +X direction and the spontaneous magnetization of the second magnetic film 122 is oriented in the −X direction. At first, at a time T1, the write current $+I_{WL}$ is supplied to the write word line 153, and at a time T2, the write current $+I_{BL}$ is supplied to the bit line 155. In succession, at a time T3, the supply of the write current $+I_{WL}$ is stopped, and a time T4, the supply of the write current $+I_{BL}$ is stopped. The execution of such current control inverts the orientations of the spontaneous magnetizations in the first magnetic film 121 and the second magnetic film 122. Then, the spontaneous magnetization of the first magnetic film 121 is oriented in the −X direction and set to the [1] write. It should be noted that even if the same writing sequence is executed, the [1] state is held without any change to the [0] state, if the initial state is in the [1] state.

FIGS. 10A and 10B and FIGS. 11A to 11E are views showing the [0] write operation in the MRAM employing the direct writing method. FIGS. 10A and 10B are the timing charts of the write current $I_{WL}$ and the write current $I_{BL}$. FIGS. 11A to 11E show the orientations of the spontaneous magnetizations of the first magnetic film 121 and the second magnetic film 122 at the respective timings of the timing charts. Those drawings show an example in which the [0] write is performed on the magnetic resistance element 101 in the [1] state, and it is set to the [0] state. In the initial state, the spontaneous magnetization of the first magnetic film 121 is assumed to be oriented in the −X direction and the spontaneous magnetization of the second magnetic film 122 is oriented in the +X direction. At first, at the time T1, the write current $-I_{WL}$ is supplied to the write word line 153, and at the time T2, the write current $-I_{BL}$ is supplied to the bit line 155. In succession, at the time T3, the supply of the write current $-I_{WL}$ is stopped, and the time T4, the supply of the write current $-I_{BL}$ is stopped. The execution of such current control inverts the orientations of the spontaneous magnetizations of the first magnetic film 121 and the second magnetic film 122. Then, the spontaneous magnetization of the first magnetic film 121 is oriented in the +X direction and set to the [0] state. It should be noted that even if the same writing sequence is executed, the [0] state is held without any change to the [1] state, if the initial state is in the [0] state.

As mentioned above, in the MRAM employing the direct writing method, the write state is determined based on the write operation. For this reason, the reading of the data stored in the target memory cell before the data is written is not required, and all of the memory cells to be written may be written.

FIG. 12 is a graph view showing a threshold property in the MRAM employing the direct writing method. In FIG. 12, the vertical axis and the horizontal axis indicate the write currents $I_{WL}$ and $I_{BL}$, respectively. The write currents $I_{WL}$ and $I_{BL}$ corresponding to the regions (direct regions) represented as [direct] on the drawing are supplied to the write word line 153 and the bit line 155, which correspond to [Selection Cell] to which the data is written. Consequently, the direct write operation is performed on the selection cell. Here, as shown in FIG. 12, this direct region does not have the X-intercept and the Y-intercept. Thus, only the magnetic field resulting from any of the write currents is applied to [Half-Selection Cell] in which any one of the write word line 153 and the bit line 155 is common to the selection cell. Thus, the direct write operation is not performed to the half-selection cell. In this way, according to the MRAM employing the direct writing method, the erroneous write is greatly reduced, as compared with the typical MRAM. Also, the write is possible in the small word current and bit current, as compared with the toggle writing method.

The operation region of the MRAM employing the direct writing method is defined as follows. FIG. 13 is a graph showing the threshold property of the MRAM employing the direct writing method in detail. The vertical axis and the horizontal axis indicate a word line vertical magnetic field $H_{WL}$ and a bit line vertical magnetic field $H_{BL}$, which are generated by the write currents $I_{WL}$, $I_{BL}$, respectively. FIG. 14 is a graph showing the spontaneous magnetization characteristic of the free magnetic layer 115 of the MRAM employing the direct writing method. The horizontal axis indicates the magnetic field $H_X$ of the magnetization easy axis (X) direction, and the vertical axis indicates the value of the synthesized spontaneous magnetization of the free magnetic layer 115 in the X-direction.

The magnetic field in the magnetization easy axis (X) direction, which is the minimal magnetic field necessary for the direct operation, is defined as [Direct Write Magnetic Field $H_{dir}$]. That is, the magnitude of the direct write magnetic field $H_{dir}$ is defined as the distance between an original point and a point b in FIG. 13. When the product of $Ms_1 \times t_1$ of the spontaneous magnetization and film thickness of the first magnetic film 121 and the product of $Ms_2 \times t_2$ of the spontaneous magnetization and film thickness of the second magnetic film 122 are different, the direct write magnetic field $H_{dir}$ is smaller than the flop field $H_{Sf}$. The curve a and the curve c are similar to FIGS. 6 and 7.

In this way, the upper limit and lower limit of the direct write operation region are determined based on the direct write magnetic field $H_{dir}$ and the flop field $H_{Sf}$ respectively. The magnetic field $H_x$ in the magnetization easy axis direction applied at the time of the write operation is required to belong to the range between the direct write magnetic field $H_{dir}$ and the flop field $H_{Sf}$, as shown in FIG. 14. The direct write magnetic field $H_{dir}$ is smaller than the flop field $H_{Sf}$. In short, in the direct writing method, the write operation can be performed in the small write current, as compared with the toggle writing method, and the smaller electric power consumption can be attained. On the other hand, as can be understood from the drawings, in the MRAM employing the direct writing method, the technique, in which the write operation region is narrow and this operation region can be further enlarged, is desired.

It should be noted that as the technique of the typical MRAM that is not based on the toggle writing method, the followings are known.

Japanese Laid Open Patent Application (JP-P2002-151758A) discloses a ferromagnetic tunnel magnetic resistance element. In a free layer of this ferromagnetic tunnel magnetic resistance element, at least 5 layers or more of ferromagnetic magnetic layers and middle layers are laminated. The magnetizations of the ferromagnetic magnetic layers of the two layers located adjacently through the middle layer are arranged in the anti-ferromagnetic manner.

A magnetic memory disclosed in Japanese Laid Open Patent Application (JP-P2003-298023A) contains two magnetic resistance elements and a common wiring interposed between them. A first magnetic resistance element has a first pin layer and a first free layer. The first pin layer includes ferromagnetic layers of even-numbered layers laminated through non-magnetic layers. The first free layer includes a ferromagnetic layer of a single layer or a plurality of ferromagnetic layers laminated through non-magnetic layers. A second magnetic resistance element has a second pin layer and a second free layer. The second pin layer includes a ferromagnetic layer of a single layer or ferromagnetic layers of three layers or more laminated through non-magnetic layers. The second free layer includes a ferromagnetic layer of a single layer or a plurality of ferromagnetic layers laminated through non-magnetic layer.

Japanese Laid Open Patent Application (JP-P2003-331574A) discloses a writing method of MRAM. This writing method has a (1) step of applying a first magnetic field, which is parallel to a hard axis, to a magnetic resistance effect device that has an easy axis and the hard axis; and a (2) step of applying a second magnetic field, which is weaker than the first magnetic field and is parallel to the hard axis, and a third magnetic field parallel to the easy axis, to the magnetic resistance effect device at the same time.

According to the magnetic resistance effect device disclosed in Japanese Laid Open Patent Application (JP-P 2004-87870A), a pin layer has a function as a magnetic field application member for applying an electrostatic field to the free layer. In order to apply an electrostatic field, the magnitude of a leakage magnetic field from the pin layer is set to be a predetermined value or more.

Japanese Laid Open Patent Application (JP-A-Heisei, 5-266651) discloses a magnetic thin film memory device. This magnetic thin film memory device stores data in accordance with the orientation of the magnetization of a magnetic thin film. This magnetic thin film has a lamination structure. Specifically, in this magnetic thin film, a magnetic layer a whose magnetic coercive force is great and a magnetic layer b whose magnetic coercive force is small are laminated through a non-magnetic layer c, such as a/c/b/c/a/c/b/c - - -.

DISCLOSURE OF INVENTION

The object of the present invention is to provide an MRAM employing an SAF structure that can suppress disturbance and can enlarge a write operation region.

Another object of the present invention is to provide an MRAM employing an SAF structure that can suppress disturbance and can reduce a write current.

In order to solve the above-mentioned problems, the writing method of the magnetic random access memory of the present invention will be described below.

Here, the magnetic random access memory (MRAM) contains a plurality of first wirings, a plurality of second wirings and a plurality of memory cells. The plurality of first wirings extend in a first direction. The plurality of second wirings extend in a second direction substantially orthogonal to the first direction. The plurality of memory cells include a free magnetic layers in which a plurality of magnetic layers coupled through non-magnetic layers anti-ferromagnetically are laminated, and they are provided for the respective points at which the plurality of first wirings and the plurality of second wirings intersect. The direction of a magnetization easy axis of the free magnetic layer is different between the first direction and the second direction. The writing method contains: (a) reading a first data stored in a selection cell selected from the plurality of memory cells; (b) comparing a second data to be written to the selection cell and the first data; and (c) supplying a first write current to a selection first wiring corresponding to the selection cell among the plurality of first wirings, in the direction based on the second data, and supplying a second write current to a selection second wiring corresponding to the selection cell among the plurality of second wirings, in the direction based on the second data. In the MRAM of the present invention, irrespectively of the relation of the spontaneous magnetizations and film thicknesses between the respective magnetic layers in the free magnetic layer, a write operation can be performed in any of a toggle write region and a direct write region. That is, the operation region can be enlarged. In addition, the direct write region can be used to reduce the write current. That is, the electric power consumption can be decreased. Also, since the write current can be reduced, the area of the transistors related to the write current can be decreased. That is, the chip area of the MRAM can be made relatively small, or the region of the memory cell can be made relatively wide.

In the writing method of the magnetic random access memory, the (c) supplying contains: (c1) when the second data is a first particular data, supplying the first write current to a first direction of the selection first wiring, subsequently supplying the second write current to a second direction of the selection second wiring, subsequently stopping the supply of the first write current, and then stopping the supply of the second write current; and (c2) when the second data is a second particular data different from the first particular data, supplying the first write current to a third direction opposite to the first direction of the selection first wiring, supplying the second write current to a fourth direction opposite to the second direction of the selection second wiring, subsequently, stopping the supply of the first write current, and then stopping the supply of the second write current. In the present invention, since the preliminary data read operation and the control of the direction of the write current are combined, the write operation can be performed in the wide operation region in which the toggle write region and the direct write region are doubly included, without any occurrence of the erroneous write.

In the writing method of the magnetic random access memory, the free magnetic layer has two layers of a first magnetic film and a second magnetic film, and a spontaneous magnetization $M_1$ and a film thickness $t_1$ of the first magnetic film and a spontaneous magnetization $M_2$ and a film thickness $t_2$ of the second magnetic film satisfy $M_1 \times t_1 \neq M_2 \times t_2$. In the present invention, the product of the spontaneous magnetization and the film thickness is not required to be set equal between the magnetic films. Thus, the manufacturing margin of the magnetic film can be set wide. That is, the manufacturing yield of the MRAM can be made high.

In the writing method of the magnetic random access memory, the free magnetic layer has the two layers of the first magnetic film and the second magnetic film, and a spontaneous magnetization $M_1$ of the first magnetic film and a spontaneous magnetization $M_2$ of the second magnetic film satisfy the following relation:

$$0.05 < M_{br} = \left| \frac{M_1 - M_2}{M_1 + M_2} \right| < 0.3$$

In the present invention, since the foregoing range is set, the write range can be made wide, as compared with a case of the single toggle write region and single direct write range, without any occurrence of the erroneous write operation of the half-selection cells.

In the writing method of the magnetic random access memory, the free magnetic layer has two layers of a first magnetic film and a second magnetic film, and a film thickness $t_1$ of the first magnetic film and a film thickness $t_2$ of the second magnetic film satisfy the following relation:

$$0.05 < t_{br} = \left| \frac{t_1 - t_2}{t_1 + t_2} \right| < 0.3$$

In the present invention, since the foregoing range is set, the write range can be made wide, as compared with the case of the single toggle write region and single direct write range, without any occurrence of the erroneous writing of the half-selection cell.

In the writing method of the magnetic random access memory, the free magnetic layer has two layers of a first magnetic film and a second magnetic film, and a one-axis anisotropic constant $K_{U1}$ of the first magnetic film and a one-axis anisotropic constant $K_{U2}$ of the second magnetic film satisfy the following relation:

$$0.05 < K_{Ubr} = \left| \frac{K_{U1} - K_{U2}}{K_{U1} + K_{U2}} \right| < 0.8$$

In the present invention, since the foregoing range is set, the write range can be made wide, as compared with the case of the single toggle write region and single direct write range, without any occurrence of the erroneous writing of the half-selection cells.

In the writing method of the magnetic random access memory, the free magnetic layer includes magnetic layers of one of (2n+1) layers (n: an integer of 1 or more) and 2n layers, and a spontaneous magnetization $Ms_{2p-1}$ and a film thickness $t_{2p-1}$ of the magnetic layer of a (2p−1)-th layer and a spontaneous magnetization $Ms_{2p}$ and a film thickness $t_{2p}$ of the magnetic layer of a 2p-th layer satisfy the following equation, by setting q=n+1 in case of the (2n+1) layers and q=n in case of the 2n layers:

$$\sum_{p=1}^{q} (Ms_{2p-1} \times t_{2p-1}) \ne \sum_{p=1}^{q} (Ms_{2p} \times t_{2p})$$

In the present invention, since the product of the spontaneous magnetization and the film thickness is not required to be equal between the magnetic films, the manufacturing margin of the magnetic film can be set wide. That is, the manufacturing yield of the MRAM can be made high.

In the writing method of the magnetic random access memory, the free magnetic layer includes magnetic layers of one of the (2n+1) layers (n: an integer of 1 or more) and 2n layers, and a film thickness $t_{2p-1}$ of the magnetic layer of a (2p−1)-th layer and a film thickness $t_{2p}$ of the magnetic layer of a 2p-th layer satisfy the following equation, by setting q=n+1 in case of the (2n+1) layers and q=n in case of the 2n layers:

$$0.05 < t_{br} = \left| \frac{\sum_{p=1}^{q} t_{2p-1} - \sum_{p=1}^{q} t_{2p}}{\sum_{p=1}^{q} t_{2p-1} + \sum_{p=1}^{q} t_{2p}} \right| < 0.3$$

In the present invention, since the foregoing range is set, the write range can be made wide, as compared with the case of the single toggle write region and single direct write region, without any occurrence of the erroneous writing of the half-selection cell.

In the writing method of the magnetic random access memory, the free magnetic layer includes magnetic layers of one of (2n+1) layers (n: an integer of 1 or more) and 2n layers, and a spontaneous magnetization $Ms_{2p-1}$ of the magnetic layer of a (2p−1)-th layer and a spontaneous magnetization $Ms_{2p}$ of the magnetic layer of a 2p-th layer satisfy the following equation, by setting q=n+1 in case of the (2n+1) layers and q=n in case of the 2n layers:

$$0.05 < M_{br} = \left| \frac{\sum_{p=1}^{q} M_{2p-1} - \sum_{p=1}^{q} M_{2p}}{\sum_{p=1}^{q} M_{2p-1} + \sum_{p=1}^{q} M_{2p}} \right| < 0.3$$

In the present invention, since the foregoing range is set, the write range can be made wide, as compared with the case of the single toggle write region and single direct write region, without any occurrence of the erroneous writing of the half-selection cells.

In the writing method of the magnetic random access memory, the free magnetic layer includes magnetic layers of one of (2n+1) layers (n: an integer of 1 or more) and 2n layers, and a one-axis anisotropic constant $K_{U2p-1}$ of the magnetic layer of a (2p−1)-th layer and a one-axis anisotropic constant $K_{U2p}$ of the magnetic layer of a 2p-th layer satisfy the following equation, by setting q=n+1 in case of the (2n+1) layers and q=n in case of the 2n layers:

$$0.05 < K_{Ubr} = \left| \frac{\sum_{p=1}^{q} K_{U2p-1} - \sum_{p=1}^{q} K_{U2p}}{\sum_{p=1}^{q} K_{U2p-1} + \sum_{p=1}^{q} K_{U2p}} \right| < 0.8$$

In the present invention, since the foregoing range is set, the write range can be made wide, as compared with the case of the single toggle write region and single direct write region, without any occurrence of the erroneous writing of the half-selection cell.

In order to solve the above-mentioned problems, a magnetic random access memory of the present invention contains a plurality of first wirings, a plurality of second wirings, a plurality of memory cells, a reading determination unit, and a current control section. The plurality of first wirings extend in a first direction. The plurality of second wirings extend in a second direction substantially orthogonal to the first direction. The plurality of memory cells include a free magnetic layers in which a plurality of magnetic layers coupled through non-magnetic layers in anti-ferromagnetically are laminated, and they are provided for the respective points at which the plurality of first wirings and the plurality of second wirings intersect, and a direction of a magnetization easy axis of the free magnetic layer differs from the first direction and the second direction. The reading determination unit, when a second data is written to a selection cell selected from the plurality of memory cells through a selection first wiring selected from the plurality of first wiring and a selection second wiring selected from the plurality of second wirings, compares a first data stored in the selection cell and the second data. The current control section, when the first data and the second data are different, controls the direction of the first write current supplied to the selection first wiring and the direction of the second write current supplied to the selection second wiring, in accordance with the second data.

In the magnetic random access memory, the current controller, when the second data is the first particular data, supplies the first write current to the first direction of the selection first wiring, and then supplies the second write current to the second direction of the selection second wiring, and then stops the first write current, and after that, stops the second write current. When the second data is the second particular data different from the first particular data, this supplies the first write current to the third direction opposite to the first direction of the selection first wiring, and then supplies the second write current to the fourth direction opposite to the second direction of the selection second wiring, and then stops the first write current, and after that, stops the second write current.

In the magnetic random access memory, the direction of the magnetization easy axis direction of the free magnetic layer has the angle of about 45 degrees with respect to the first direction and the second direction.

In the magnetic random access memory, the current control section contains a first current direction controller and a second current direction controller. The first current direction controller, when the second data is the first particular data, outputs the first write current and the second write current to supply the first write current to the first direction of the selection first wiring and supply the second write current to the second direction of a selection second wiring. The second current direction controller, when the second data is the second particular data different from the first particular data, outputs the first write current and the second write current to supply the first write current to the third direction opposite to the first direction of the selection first wiring and supply the second write current to the fourth direction opposite to the second direction of the selection second wiring.

In the magnetic random access memory, the current controller further contains a first current source, a second current source and a write controller. The first current source supplies the first write current to one of the first current direction controller and the second current direction controller. The second current source supplies the second write current to one of the first current direction controller and the second current direction controller. The write controller controls the timings of the current supplies to the first current source and the second current source.

In the magnetic random access memory, the write controller controls the timings by turning on/off the first current source and the second current source.

In the magnetic random access memory, this further contains a first X selector, a second X selector, a first Y selector and a second Y selector. One ends of the plurality of first wirings are connected to the first X selector, which selects the selection first wiring. The other ends of the plurality of first wirings are connected to the second X selector, which selects the selection first wiring. One ends of the plurality of second wirings are connected to the first Y selector, which selects the selection second wiring. The other ends of the plurality of second wirings are connected to the second Y selector, which selects the selection second wiring. When the second data is the first particular data, the first current source outputs the first write current to the first current direction controller. The second current source outputs the second write current to the first current direction controller. The first current direction controller outputs the first write current to the first X selector and outputs the second write current to the first Y selector. When the second data is the second particular data, the first current source outputs the first write current to the second current direction controller. The second current source outputs the second write current to the second current direction controller. The second current direction controller outputs the first write current to the second X selector and outputs the second write current to the second Y selector.

In the magnetic random access memory, the free magnetic layer is two layers of a first magnetic film and a second magnetic film, a spontaneous magnetization $M_1$ and a film thickness $t_1$ of the first magnetic film and a spontaneous magnetization $M_2$ and a film thickness $t_2$ of the second magnetic film satisfy $M_1 \times t_1 \neq M_2 \times t_2$.

In the magnetic random access memory, the free magnetic layer has two layers of a first magnetic film and a second magnetic film, and a spontaneous magnetization $M_1$ of the first magnetic film and a spontaneous magnetization $M_2$ of the second magnetic film satisfy the following equation:

$$0.05 < M_{br} = \left| \frac{M_1 - M_2}{M_1 + M_2} \right| < 0.3$$

In the magnetic random access memory, the free magnetic layer has the two layers of a first magnetic film and a second magnetic film, and a film thickness $t_1$ of the first magnetic film and a film thickness $t_2$ of the second magnetic film satisfy the following equation:

$$0.05 < t_{br} = \left| \frac{t_1 - t_2}{t_1 + t_2} \right| < 0.3$$

In the magnetic random access memory, the free magnetic layer has two layers of a first magnetic film and a second magnetic film, and a one-axis anisotropic constant $K_{U1}$ of the first magnetic film and a one-axis anisotropic constant $K_{U2}$ of the second magnetic film satisfy the following relation:

$$0.05 < K_{Ubr} = \left| \frac{K_{U1} - K_{U2}}{K_{U1} + K_{U2}} \right| < 0.8$$

In the magnetic random access memory, the free magnetic layer includes magnetic layers of one of (2n+1) layers (n: an integer of 1 or more) and 2n layers, and a spontaneous magnetization $Ms_{2p-1}$ and a film thickness $t_{2p-1}$ of the magnetic layer of a (2p−1)-th layer and a spontaneous magnetization $Ms_{2p}$ and a film thickness $t_{2p}$ of the magnetic layer of a 2p-th layer satisfy the following equation, by setting q=n+1 in case of the (2n+1) layers and q=n in case of the 2n layers:

$$\sum_{p=1}^{q} (Ms_{2p-1} \times t_{2p-1}) \neq \sum_{p=1}^{q} (Ms_{2p} \times t_{2p})$$

In the magnetic random access memory, the free magnetic layer includes magnetic layers of one of (2n+1) layers (n: an integer of 1 or more) and 2n layers, and a film thickness $t_{2p-1}$ of the magnetic layer of a (2p−1)-th layer and a film thickness $t_{2p}$ of the magnetic layer of a 2p-th layer satisfy the following equation, by setting q=n+1 in case of the (2n+1) layers and q=n in case of the 2n layers:

$$0.05 < t_{br} = \left| \frac{\sum_{p=1}^{q} t_{2p-1} - \sum_{p=1}^{q} t_{2p}}{\sum_{p=1}^{q} t_{2p-1} + \sum_{p=1}^{q} t_{2p}} \right| < 0.3$$

In the magnetic random access memory, the free magnetic layer includes magnetic layers of one of (2n+1) layers (n: the integer of 1 or more) and 2n layers, and a spontaneous magnetization $Ms_{2p-1}$ of the magnetic layer of a (2p−1)-th layer and a spontaneous magnetization $Ms_{2p}$ of the magnetic layer of a 2p-th layer satisfy the following equation, by setting q=n+1 in case of the (2n+1) layers and q=n in case of the 2n layers:

$$0.05 < M_{br} = \left| \frac{\sum_{p=1}^{q} M_{2p-1} - \sum_{p=1}^{q} M_{2p}}{\sum_{p=1}^{q} M_{2p-1} + \sum_{p=1}^{q} M_{2p}} \right| < 0.3$$

In the magnetic random access memory, the free magnetic layer includes magnetic layers of one of (2n+1) layers (n: an integer of 1 or more) and 2n layers, and a one-axis anisotropic constant $K_{U2p-1}$ of the magnetic layer of a (2p−1)-th layer and a one-axis anisotropic constant $K_{U2p}$ of the magnetic layer of a 2p-th layer satisfy the following equation, by setting q=n+1 in case of the (2n+1) layers and q=n in case of the 2n layers:

$$0.05 < K_{Ubr} = \left| \frac{\sum_{p=1}^{q} K_{U2p-1} - \sum_{p=1}^{q} K_{U2p}}{\sum_{p=1}^{q} K_{U2p-1} + \sum_{p=1}^{q} K_{U2p}} \right| < 0.8$$

BRIEF DESCRIPTION OF THE DRAWINGS

FIG. 1 is a conceptual diagram showing a SAF structure of a magnetic resistance element of an MRAM in a related art;

FIG. 2 is a conceptual diagram showing the SAF structure of the magnetic resistance element of the MRAM in a related art;

FIG. 3 is a plan view showing the orientation of a spontaneous magnetization in the MRAM employing the SAF structure;

FIGS. 4A and 4B are timing charts showing a write operation in the MRAM employing the toggle writing method;

FIG. 5 is a graph showing threshold characteristics of the MRAM employing the toggle writing method;

FIG. 6 is a graph showing the threshold characteristics of the MRAM employing the toggle writing method in detail;

FIG. 7 is a graph showing magnetic resistance characteristics of a free magnetic layer in the MRAM employing the toggle writing method;

FIGS. 8A and 8B are timing charts showing a [1] write operation in the MRAM employing a direct writing method;

FIGS. 9A to 9E are diagrams showing the [1] write operation in the MRAM employing the direct writing method;

FIGS. 10A and 10B are timing charts showing a [0] write operation in the MRAM employing the direct writing method;

FIGS. 11A to 11E are diagrams showing the [0] write operation in the MRAM employing the direct writing method;

FIG. 12 is a graph showing the threshold characteristics of the MRAM employing the direct writing method;

FIG. 13 is a graph showing the threshold characteristics of the MRAM employing the direct writing method in detail;

FIG. 14 is a graph showing a spontaneous magnetization characteristic of a free magnetic layer in the MRAM employing the direct writing method;

FIG. 15 is a block diagram showing a configuration of a magnetic random access memory (MRAM) according to an embodiment of the present invention;

FIG. 16 is a plan view showing the configuration of a magnetic resistance element in the MRAM according to the embodiment of the present invention;

FIG. 17 is a sectional view showing the structure of the magnetic resistance element in the MRAM according to the embodiment of the present invention;

FIG. 18 is a table showing the features of respective writing methods;

FIG. 19 is a graph showing a writable regions in the toggle writing method and the direct writing method;

FIG. 20 is a graph showing the writable region in s writing method according to the present invention;

FIG. 21 is a flowchart showing the writing method in the embodiment of the MRAM of the present invention;

FIG. 22 is a diagram showing a layout of the SAF structure used in this calculation;

FIG. 23 is a sectional view showing a magnetic resistance element having a structure A;

FIG. 24 is a graph showing a critical magnetic field curve of the magnetic resistance element having the structure A;

FIG. 25 is a graph in which the region of a direct write magnetic field $H_{dir}$ of FIG. 22 is enlarged;

FIG. 26 is a graph in which the region of the direct write magnetic field $H_{dir}$ of FIG. 22 is enlarged;

FIG. 27 is a sectional view showing a magnetic resistance element having a structure B;

FIG. 28 is a graph showing the critical magnetic field curve of the magnetic resistance element having the structure B;

FIG. 29 is a graph in which the region of a direct write magnetic field $H_{dir}$ of FIG. 26 is enlarged;

FIG. 30 is a graph in which the region of the direct write magnetic field $H_{dir}$ of FIG. 26 is enlarged;

FIG. 31 is a sectional view showing a magnetic resistance element having a structure C;

FIG. 32 is a graph showing the critical magnetic field curve of the magnetic resistance element having the structure C;

FIG. 33 is a graph in which the region of a direct write magnetic field $H_{dir}$ of FIG. 30 is enlarged;

FIG. 34 is a graph in which the region of the direct write magnetic field $H_{dir}$ of FIG. 30 is enlarged; and FIG. 35 is a sectional view showing another structure of the magnetic resistance element in the embodiment of the MRAM of the present invention.

BEST MODE FOR CARRYING OUT THE INVENTION

Hereinafter, the magnetic random access memory (MRAM) of the present invention will be described in detail with reference to the attached drawings. The MRAM of the present invention is an MRAM that includes the magnetic resistance element having an SAF structure and uses a new writing method.

At first, the configuration of the magnetic random access memory (MRAM) according to the embodiment of the present invention will be described. FIG. 15 is a block diagram showing the configuration of the magnetic random access memory (MRAM) according to the embodiment of the present invention. An MRAM 40 contains a first X selector 41, a second X selector 42, a first Y selector 43, a second Y selector 44, a first write current source 45, a second write current source 46, a sense amplifier 47, a read determination circuit 48, a reference voltage generating circuit 49, a write controller 50, a memory cell array 51, a first current direction control circuit 58 and a second current direction control circuit 59.

The memory cell array 51 contains a plurality of memory cells 52, a plurality of write word lines 53, a plurality of read word lines 54, and a plurality of bit lines 55. The plurality of write word lines 53 are formed to extend in an S-direction. One end of the write word line 53 is connected to the first X selector 41, and the other end thereof is connected to the second X selector 42. The plurality of read word lines 54 are formed to extend in the S-direction. One end of the read word line 54 is connected to the first X selector 41, and the other end thereof is connected to the second X selector 42. One write word line 53 and one read word lines 54 are defined as one set. The plurality of bit lines 55 are formed to extend in a T-direction. One end of the bit line 55 is connected to the first Y selector 43, and the other thereof end is connected to the second Y selector. It should be noted that the bit line 55 is commonly used in a write operation and a read operation. However, they may be divided into a write bit line and a write word line. The S-direction and the T-direction are orthogonal to each other as shown in FIG. 15. Each of the plurality of memory cells 52 includes the magnetic resistance element 1 (which will be described later) and is provided at one of the intersection points between the plurality of write word lines 53 and the plurality of bit lines 55.

The first X selector 41 selects a selection write word line 53s from the plurality of write word lines 53 in accordance with an X-address at the time of the write operation. The first X selector 41 selects a selection read word line 54s from the plurality of read word lines 54 in accordance with the X-address at the time of the read operation. The second X selector 42 selects the selection write word line 53s from the plurality of write word lines 53 in accordance with the X-address at the time of the write operation. Write currents $\pm I_{WL}$ flow through the selection write word lines 53s selected by the first X selector 41 and the second X selector 42.

The first Y selector 43 selects a selection bit line 55s from the plurality of bit lines 55 in accordance with a Y-address at the time of the write operation and at the time of the read operation. The second Y selector 44 selects the selection bit line 55s from the plurality of bit lines 55 in accordance with the Y-address at the time of the write operation. Write currents $\pm I_{BL}$ flow through the selection bit lines 55s selected by the first Y selector 43 and the second Y selector 44.

Each selector selects the memory cell 52 corresponding to the point at which the selection write word line 53s and the selection bit line 55s intersect, as a selection cell 52s to perform the write operation at the time of the write operation. Similarly, each selector selects the memory cell 52 corresponding to the point at which the selection read word line 54s and the selection bit line 55s intersect, as a selection cell 52s to performs the read operation at the time of the read operation.

The first write current source 45 outputs the write current $I_{WL}$ to the first current direction control circuit 58 and the second current direction control circuit 59 in accordance with a current output signal TOG1 at the time of the write operation. The first write current source 45 may be turned ON/OFF with the current output signal TOG1. The second write current source 46 outputs the write current $I_{BL}$ to the first current direction control circuit 58 and the second current direction control circuit 59 in accordance with a current output signal TOG2 at the time of the write operation. The second write current source 46 may be turned ON/OFF with the current output signal TOG2.

The first current direction control circuit 58 outputs the write current $I_{WL}$ from the first write current source 45 to the first X selector 41, when the write current $+I_{WL}$ (the +S direction) is sent in accordance with a write control signal A at the time of the write operation. Consequently, the write current $+I_{WL}$ of the +S direction flows through the selection write word line 53s. At this time, the second current direction control circuit 59 terminates the write current $+I_{WL}$ via the second X selector 42. Also, the first current direction control circuit 58 outputs the write current $I_{BL}$ from the second write current source 46 to the first Y selector 43, when the write current $+I_{BL}$ (the +T direction) is sent in accordance with the write control signal A at the time of the write operation. Consequently, the write current $+I_{BL}$ of the +T direction flows through the selection bit line 55s. At this time, the second current direction control circuit 59 terminates the write current $+I_{BL}$ via the second Y selector 44.

The second current direction control circuit 59 outputs the write current $I_{WL}$ from the first write current source 45 to the second X selector 42, when the write current $-I_{WL}$ (the -S direction) is sent in accordance with the write control signal A at the time of the write operation. Thus, the write current $-I_{WL}$ of the -S direction flows through the selection write word line 53s. At this time, the first current direction control circuit 58 terminates the write current $-I_{WL}$ via the first X selector 41. Also, the second current direction control circuit 59 outputs the write current $I_{BL}$ from the second write current source 46 to the second Y selector 44, when the write current $-I_{BL}$ (the -T direction) is sent in accordance with the write control signal A at the time of the write operation. Thus, the write current $-I_{BL}$ of the -T direction flows through the selection bit line 55s. At this time, the first current direction control circuit 58 terminates the write current $-I_{BL}$ via the first Y selector 43.

The reference voltage generating circuit 49 outputs a reference voltage to the sense amplifier 47 at the time of the read operation. The sense amplifier 47 reflects the state of the magnetic resistance element in the selection cell 52s at the time of the read operation and compares the voltage, in which the current flowing through the selection bit line 55s is converted, with the reference voltage and then outputs a data Dout ([1] or [0]) written in the selection cell 52s.

The read determination circuit 48 compares the data Dout written in the selection cell 52s and a data Din ([1] or [0]) to be written. In accordance with the comparison result, a write instruction signal B is outputted. The write instruction signal B is a signal for instructing that the write operation is performed if the data Dout and the data Din are not coincident, and this is a signal for instructing that the write operation is not performed if both are coincident. It should be noted that the circuits related to the read circuit except the foregoing cases on this drawing are omitted.

An address signal and the data Din are supplied to the write controller 50 at the time of the write operation. Then, at first, an operation is performed for outputting an X address signal to the first X selector 41 and outputting a Y address to the first Y selector 43, in accordance with the address signal, and for reading the data Dout from the memory cell 52 (selection cell 52s) instructed based on the address signal is executed. Then, if a write instruction signal B from the read determination circuit 48 is a signal indicating that the write operation is not performed, the write operation is ended at this time. In case of a signal for instructing that the write operation is performed, in accordance with whether the value of the data Din is [1] or [0], the write control signal A instructing that the write current is supplied is outputted to any one of the first current direction control circuit 58 and the second current direction control circuit 59, and the write control signal A instructing that the write current is terminated is outputted to the other one, respectively. At that time, the current output signal TOG1 is outputted to the first write current source 45 at a predetermined first timing. Similarly, the current output signal TOG2 is outputted to the second write current source 46 at a predetermined second timing.

In this MRAM 40, both of the directions of the write currents on the selection bit line 55s and the selection write word line 53s are changed in accordance with the data Din by using the first current direction control circuit 58 and the second current direction control circuit 59, in order to attain the direct write operation. On the other hand, the timings of the outputs of the first write current source 45 and the second write current source 46 are adjusted in accordance with the current output signal TOG1 outputted at the first timing and the current output signal TOG2 outputted at the second timing, in order to attain the toggle write operation.

FIG. 16 is a plan view showing the configuration of the magnetic resistance element of the MRAM in the embodiment of the present invention. The magnetic resistance element 1 in the memory cell 52 is arranged and sandwiched between the write word line 53 and the bit line 55. Here, [Magnetization Easy Axis Direction] of a free magnetic layer 15 (which will be described later) in the magnetic resistance element 1 is defined as the X-direction, and [Magnetization Hard Axis Direction] is defined as the Y-direction. The write current $I_{WL}$ (+$I_{WL}$ in this example) flows through the write word line 53, and the write current $I_{BL}$ (+$I_{BL}$ in this example) flows through the bit line 55, respectively. In the MRAM of the SAF structure, the magnetic resistance element 1 is arranged in such a manner that the magnetization easy axis direction (X direction) has the angle of 45 degrees with respect to the S-direction or T-direction. In the stable state, the spontaneous magnetization (the thick arrow mark) of a first magnetic film 21-1 and the spontaneous magnetization (thin arrow mark) of a second magnetic film 21-2 are oppositely parallel to each other, and oriented to the magnetization easy axis direction.

At the time of the write operation for the [1] write, the write current +$I_{WL}$ is supplied to the write word line 53. A write magnetic field −$H_{WL}$ in the −T direction is generated by this write current +$I_{WL}$. Also, the write current +$I_{BL}$ is supplied to the bit line 55. A write magnetic field −$H_{BL}$ in the −S direction is generated by this write current +$I_{BL}$.

On the other hand, at the time of the write operation for the [0] write, the write current −$I_{WL}$ is supplied to the write word line 53. A write magnetic field +$H_{WL}$ in the +T direction is generated based on this write current −$I_{WL}$. Also, the write current −$I_{BL}$ is supplied to the bit line 55. A write magnetic field +$H_{BL}$ in the +S direction is generated based on this write current −$I_{BL}$.

The magnetic resistance element 1 in a memory cell 4 is provided at the intersection of the write word line 53 and the bit line 55. The magnetic resistance element 1 is arranged such that this is sandwiched between the write word line 53 and the bit line 55. The write magnetic fields ±$H_{WL}$ and ±$H_{BL}$ act on this magnetic resistance element 1. The magnetization easy axis direction of the free magnetic layer (free layer) 15 included in the magnetic resistance element 1 is defined as the X-direction, and the magnetization difficulty axis direction is defined as the Y-direction. As shown in FIG. 16, the X-direction has the angle of about 45 degrees with respect to the S-direction and the T-direction. In short, the magnetic resistance element 1 is arranged such that the angle between the magnetization easy axis and the write word line 53 and the bit line 55 becomes about 45 degrees.

FIG. 17 is a sectional view showing the structure of the magnetic resistance element of the MRAM in the embodiment of the present invention. This magnetic resistance element 1 includes a lower electrode 11, an anti-ferromagnetic layer 12, a fixed magnetic layer (pinned magnetic layer) 13, a barrier layer 14, a free magnetic layer (free magnetic layer) 15 and an upper electrode layer 16. Both of the fixed magnetic layer 13 and the free magnetic layer 15 have ferromagnetic layers having the spontaneous magnetizations. The orientation of the spontaneous magnetization of the fixed magnetic layer 13 is fixed to a predetermined direction. On the other hand, the orientation of the spontaneous magnetization of the free magnetic layer 15 can be inverted. The barrier layer 14 is a non-magnetic layer including an insulating film or metal film and sandwiched between the fixed magnetic layer 13 and the free magnetic layer 15. The barrier layer 14 is, for example, a tunnel insulating film. At this time, the fixed magnetic layer 13, the barrier layer 14 and the free magnetic layer 15 constitute a magnetic tunnel junction (MTJ).

The free magnetic layer 15 includes the magnetic films 21-1 and 21-2 of the two layers coupled to each other in the anti-ferromagnetic manner. In short, the free magnetic layer 15 is composed of the magnetic films of the two layers, and they are coupled to each other in the anti-ferromagnetic manner. A non-magnetic film (anti-ferromagnetic coupling film) 23 is formed between the magnetic films of the two layers to attain the anti-ferromagnetic coupling. Here, the product $Ms_1 \times t_1$ of the spontaneous magnetization $M_1$ and film thickness $t_1$ of a first magnetic film 20-1 and the product $Ms_2 \times t_2$ of the spontaneous magnetization $M_2$ and film thickness $t_2$ of the second magnetic film 20-2 have the relation of the following equation (1).

$$Ms_1 \times t_1 \neq Ms_2 \times t_2 \quad (1)$$

As the material of the magnetic films 21 (21-1, 21-2), the material that is selected from the group of Ni, Fe, Co, Mn and a compound including at least one of them is exemplified. The film thickness of the magnetic film 20 is exemplified between 1.5 nm and 10 nm. As the material of the non-magnetic layer 23, the material that is selected from the group of Ru, Os, Re, Ti, Cr, Rh, Cu, Pt, Pd and a compound including at least one of them is exemplified. The film thickness of a non-magnetic film 30 is exemplified between 0.4 nm and 3 nm.

This magnetic resistance element 1 has two stable states. As shown by arrow marks in FIG. 17, in a [First State], the orientation of the spontaneous magnetization of the magnetic film 20-1 adjacent to the barrier layer 14 is "Oppositely Parallel" to the orientation of the spontaneous magnetization of the fixed magnetic layer 13. On the other hand, in [Second State], the orientation of the spontaneous magnetization of the magnetic film 20-1 is "Parallel" to the orientation of the spontaneous magnetization of the fixed magnetic layer 13. With the magnetic resistance effect, the resistance value (R+ΔR) of the magnetic resistance element 1 in the first sate is higher than the resistance value (R) in the second state. In the MRAM 40, the change in this resistance value is used, thereby storing the data in the non-volatile manner. For example, the first state shown in FIG. 17 is correlated to a data [1], and the second state is correlated to a data [0].

The read of the data stored in a certain memory cell 52 is performed by detecting the magnitude of the resistance value of this magnetic resistance element 1. Specifically, a predetermined voltage is applied between the lower electrode 11 and the upper electrode 16, and the magnitude of the current flowing through a magnetic resistance element 10 is detected, thereby detecting the magnitude of the resistance value. The data stored in the target memory cell 4 is determined in accordance with the magnitude of the detected resistance value. Also, the write of the data is performed by inverting the orientations of the spontaneous magnetizations of the magnetic films 20-1 and 20-2 included in the free magnetic layer 15. As the writing method in the SAF structure, there are the (1) toggle writing method, the (2) direct writing method and the (3) writing method of the present invention.

FIG. 18 is a table showing features of the various writing methods. As shown in this drawing, in the (1) toggle writing method (toggle), the write operation is performed, when there is the read operation prior to the write operation and the read data and the write data are different. The write current is $+I_{WL}$ and $+I_{BL}$ (or, $-I_{WL}$ and $-I_{BL}$). In the (2) direct writing method, the write operation is performed in all cases when there is no read operation prior to the write operation. The write current is $+I_{WL}$ and $+I_{BL}$ in case of the [1] write, and $-I_{WL}$ and $-I_{BL}$ in case of the [0] write. In the (3) writing method of the present invention, the write operation is performed when there is the read operation prior to the write operation, and the read data and the write data are different. The write current is $+I_{WL}$ and $+I_{BL}$ in case of the [1] write, and $-I_{WL}$ and $-I_{BL}$ in case of the [0] write.

FIG. 19 is a diagram showing writable regions in the toggle writing method and the direct writing method. In the toggle writing method, the write operation is possible between the current value corresponding to the flop magnetic field $H_{Sf}$ and the current value corresponding to the saturation magnetic field $H_{Sat}$. Thus, as compared with the direct writing method, the writable region ([toggle] on the drawing) is wide. In short, the operation margin is wide. On the other hand, as compared with the direct writing method, the minimal value of the write currents ($I_{WL}$, $I_{BL}$) is high. In short, the minimal value of the write current is high. Also, in the toggle writing method, the equation (1) is defined as the condition. Under this condition, the direct write magnetic field $H_{dir}$ and the flop magnetic field $H_{Sf}$ in FIG. 13 or FIG. 14 are coincident, and the direct write region is removed.

In the direct writing method, the write operation is possible between the write currents ($I_{WL}$, $I_{BL}$) corresponding to the direct write magnetic field $H_{dir}$ and the write currents ($I_{WL}$, $I_{BL}$) corresponding to the flop magnetic field $H_{Sf}$. However, as compared with the toggle writing method, the writable region ([direct] on the drawing) is narrow. In short, the operation margin is narrow. On the other hand, as compared with the toggle writing method, the minimal value of the write currents ($I_{WL}$, $I_{BL}$) is small. In short, it is known that the minimal value of the write current value is small, and attainment of the smaller electric power consumption is possible.

FIG. 20 shows the writable region based on the writing method according to the present invention. In the writing method according to the present invention, the write operation is possible between the write currents ($I_{WL}$, $I_{BL}$) corresponding to the direct write magnetic field $H_{dir}$ and the write currents ($I_{WL}$, $I_{BL}$) corresponding to the saturation magnetic field $H_{Sat}$. The writable region ([direct]+[toggle] on the drawing) is known to be wider than the toggle writing method ([toggle]). In short, the operation margin is known to be wide. Moreover, in the writing method according to the present invention, the minimal value of the write currents ($I_{WL}$, $I_{BL}$) is small. In short, it is known that the minimal value of the write current value is small, and the attainment of the smaller electric power consumption is possible.

The write operation will be described below.

FIG. 21 is the flowchart showing the writing method in the MRAM according to the embodiment of the present invention.

(1) Step S01

The address signal and the data Din are sent to the write controller 50. The address signal indicates the address of the memory cell 52 (selection cell 52s) into which the data is written, and includes the X-address and the Y-address. The data Din indicates the data ([1] or [0]) to be written into the selection cell 52s. Then, in accordance with the address signal, the X address signal is outputted to the first X selector 41, and the Y-address is outputted to the first Y selector 43. The first X selector 41 selects the selection read word line 54s in accordance with the X address signal. The first Y selector 43 selects the selection bit line 55s in accordance with the Y address signal. Thus, the selection cell 52s is selected. A power source circuit (not shown) for the read operation applies predetermined voltages to the selection bit line 55s and the selection read word line 54s. The current in which the state of the magnetic resistance element in the selection cell 52s is reflected flows through the selection read word line 54s—the selection cell 52s—the selection bit line 55s. The sense amplifier 47 outputs the data Dout ([1] or [0]) having written in the selection cell 52s in accordance with the voltage after the current is converted into the voltage, and the reference voltage of the reference voltage generating circuit 49.

(2) Step S02

The read determination circuit 48 receives the write data Din ([1] or [0]) from the write controller 50. The read determination circuit 48 determines whether or not the read data Dout and the write data Din are coincident. If they are coincident (Step S02:Y), the read determination circuit 48 outputs the write instruction signal B which instructs that the write operation is not performed. The write controller 50 finishes the write operation in accordance with the write instruction signal B. If they are not coincident (Step S02: N), the read determination circuit 48 outputs the write instruction signal B which instructs that the write operation is performed.

(3) Step S03

The write controller 50 performs the operation of a step S04 if the data Din is [1] and the operation of a step S05 if the data Din is [0], respectively, in accordance with the write instruction signal B.

(4) Case that Data Din is [1]

The write controller 50 outputs the write control signal A which indicates that the write current is sent to the first current direction control circuit 58 and outputs the write control signal A which indicates the termination of the write current to the second current direction control circuit 59, respectively.

Also, the write controller 50 outputs the X address signal to the first X selector 41 and the second X selector 42 and outputs the Y address to the first Y selector 43 and the second Y selector 44. The first X selector 41 and the second X selector 42 select the selection write word line 53s in accordance with the X address signal. The first Y selector 43 and the second Y selector 44 select the selection bit line 55s in accordance with the Y address signal. Consequently, the selection cell 52s is selected.

After that, the write controller 50 outputs the current output signal TOG1 to the first write current source 45 at a predetermined first timing. Similarly, the write controller 50 outputs the current output signal TOG2 to the second write current source 46 at a predetermined second timing. Those timings are timings at which the write currents $I_{WL}$ and $I_{BL}$ serve as the time chart in FIGS. 8A and 8B.

Through those controls, the write current $+I_{WL}$ is supplied in a path of the first write current source 45—the first current direction control circuit 58—the first X selector 41—the selection write word line 53s—the second X selector 42. The write magnetic field $-H_{WL}$ in the $-T$ direction is generated by this write current $+I_{WL}$. Simultaneously, the write current $+I_{BL}$ is supplied in a path of the second write current source 46—the first current direction control circuit 58—the first Y selector 43—the selection bit line 55s—the second Y selector 44. The write magnetic field $-H_{BL}$ in the $-S$ direction is generated by this write current $+I_{BL}$. That is, at a time T1, the write current $+I_{WL}$ is supplied to the selection write word line 53s, and at a time T2, the write current $+I_{BL}$ is supplied to the selection bit line 55s. In succession, at a time T3, the supply of the write current $+I_{WL}$ is stopped, and at a time T4, the supply of the write current $+I_{BL}$ is stopped. Here, the time T1<the time T2<the time T3<the time T4. Since the foregoing current control is performed, the orientations of the spontaneous magnetizations in the first magnetic film 20-1 and the second magnetic film 20-2 are inverted.

Through the foregoing operations, the write operation of the [1] write has been completed.

(5) Case that Data Din is [0]

The write controller 50 outputs the write control signal A which instructs that the write current is sent to the second current direction control circuit 59 and outputs the write control signal A which instructs the termination of the write current to the first current direction control circuit 58, respectively.

Also, the write controller 50 outputs the X address signal to the first X selector 41 and the second X selector 42 and outputs the Y address to the first Y selector 43 and the second Y selector 44. The first X selector 41 and the second X selector 42 select the selection write word line 53s in accordance with the X address signal. The first Y selector 43 and the second Y selector 44 select the selection bit line 55s in accordance with the Y address signal. Consequently, the selection cell 52s is selected. After that, the write controller 50 outputs the current output signal TOG1 to the first write current source 45 at the predetermined first timing. Similarly, this outputs the current output signal TOG2 to the second write current source 46 at the predetermined second timing. Those timings are the timings at which the write currents $I_{WL}$, $I_{BL}$ serve as the time chart in FIGS. 9A to 9E.

Through those controls, the write current $-I_{WL}$ is supplied in a path of the first write current source 45—the second current direction control circuit 59—the second X selector 42—the selection write word line 53s—the first X selector 41. The write magnetic field $+H_{WL}$ in the $+T$ direction is generated by this write current $-I_{WL}$. Simultaneously, the write current $-I_{BL}$ is supplied in a path of the second write current source 46—the second current direction control circuit 59—the second Y selector 44—the selection bit line 55s—the first Y selector 43. The write magnetic field $+H_{BL}$ in the $+S$ direction is generated by this write current $-I_{BL}$. That is, at the time T1, the write current $-I_{WL}$ is supplied to the selection write word line 53s, and at the time T2, the write current $-I_{BL}$ is supplied to the selection bit line 55s. In succession, at the time T3, the supply of the write current $-I_{WL}$ is stopped, and at the time T4, the supply of the write current $-I_{BL}$ is stopped. Here, the time T1<the time T2<the time T3<the time T4. Since the foregoing current control is performed, the orientations of the spontaneous magnetizations in the first magnetic film 20-1 and the second magnetic film 20-2 are inverted.

Through the foregoing operations, the write operation of the [0] write has been completed.

In the [1] write operation and [0] write operation based on the writing method according to the present invention, when the write current is assumed to exist in the toggle write region, the write operation is possible because the memory state is changed from the initial state by the foregoing operation. When the write current is assumed to exist in the direct write region, the write operation is possible because the basic operation is similar to the direct write region. That is, as shown in FIG. 20, the writing method according to the present invention can improve the operational stability because the operation margin becomes wide. Also, since the operation region is not limited to the toggle write region, the minimal value of the write current can be reduced to a small value, and the electric power consumption can be decreased.

Moreover, since the value of the write current can be reduced to the small value, the area of the transistors related to the write current can be decreased. Consequently, the area of the memory cells inside the semiconductor chip of the MRAM can be made relatively wide. Or, the size of the semiconductor chip of the MRAM can be decreased.

Moreover, as indicated by the equation (12), the $Ms_1 \times t_1$ of the first magnetic film 20-1 and the $Ms_2 \times t_2$ of the second magnetic film 20-2 are not required to be equal to each other. Thus, as compared with the MRAM employing the toggle writing method, the manufacturing margin is wide, which can improve the manufacturing yield. That is, in the writing method of the present invention, it is possible to attain the higher operation margin, the smaller electric power consumption and the higher manufacturing yield.

The inventors of this application discovered and proved that the operation region of the MRAM 40 was enlarged by using the foregoing writing method. Moreover, the inventors of this application discovered and proved that the write current of the MRAM 40 was reduced by using the foregoing writing method. The data indicating its base will be described below in detail.

It is supposed that the typical SAF structure has the free magnetic layers (the first magnetic film 21-1 and the second magnetic film 21-2) of the two layers. How the spontaneous magnetizations of the respective free magnetic layers (the first magnetic film 21-1 and the second magnetic film 21-2) react to the applied magnetic field inside the plane is examined by applying a Stoner-Wohlfarth model. Here, the assumption is defined as follows. The first magnetic film 21-1 and the second magnetic film 21-2 have the film thicknesses $t_1$ and $t_2$, the spontaneous magnetizations $M_1$ and $M_2$ and the one-axis anisotropic constants $K_{U1}$ and $K_{U2}$, respectively. The magnetization easy axes of the two layers are parallel to each other.

At this time, the energy density per unit region is represented by the following equation (2).

$$W = K_{U1}t_1 \sin^2\theta_1 + K_{U2}t_2 \sin^2\theta_2 - M_1 t_1 (Hx \cos\theta_1 + Hy \sin\theta_1) - M_2 t_2 (Hx \cos\theta_2 + Hy \sin\theta_2) + J \cos(\theta_1 - \theta_2) \quad (2)$$

FIG. 22 is a diagram showing the layout of the SAF structure used in this calculation. This shows a sectional view of the magnetic resistance element 1. Here, $\theta_1$ and $\theta_2$ indicate the angles between the spontaneous magnetizations $M_1$ and $M_2$ of the first magnetic film 21-1 and the magnetic film 21-2 and the magnetization easy axis direction (the X-direction on the drawing), respectively. Hx and Hy indicate the magnetization easy axis direction component of the applied magnetic field, and the magnetization hard axis direction (the Y-direction on the drawing). J indicates the anti-ferromagnetic coupling energy between the first magnetic film 21-1 and the second magnetic film 21-2. Since W is normalized in accordance with $2K_{U1}t_1$, the following relation is obtained.

$$w = \frac{1}{2}(\sin^2\theta_1 + k t\sin^2\theta_2) - (h_x\cos\theta_1 + h_y\sin\theta_1) - \qquad (3)$$
$$mt(h_x\cos\theta_2 + h_y\sin\theta_2) + h_j\cos(\theta_1 - \theta_2)$$

Here, $$k = \frac{K_{U2}}{K_{U1}}, \qquad (4)$$
$$m = \frac{M_2}{M_1},$$
$$t = \frac{t_2}{t_1},$$
$$h_j = \frac{J}{2K_{U1}t_1},$$
$$h_x = \frac{Hx}{H_K},$$
$$h_y = \frac{Hy}{H_K},$$
$$H_K = \frac{2K_{U1}}{M_1}$$

From the above equation (2), the stable condition of the system, and from the equations (5) and (6), the critical magnetic field curve can be determined.

$$\frac{\partial w}{\partial \theta_1} = 0, \; \frac{\partial w}{\partial \theta_2} = 0 \qquad (5)$$

$$\frac{\partial^2 w}{\partial \theta_1^2} > 0, \; \frac{\partial^2 w}{\partial \theta_2^2} > 0, \; D = \left(\frac{\partial^2 w}{\partial \theta_1^2}\right) \times \left(\frac{\partial^2 w}{\partial \theta_2^2}\right) - \left(\frac{\partial^2 w}{\partial \theta_1 \partial \theta_2}\right) \qquad (6)$$

The case of applying this writing method to the actual system will be considered below.

First Example

FIG. 23 is a sectional view showing a magnetic resistance element having a structure A. This magnetic resistance element contains a seed layer 17, an anti-ferromagnetic layer 12, a fixed magnetic layer 13, a barrier layer 14, a free magnetic layer 15 and a cap layer 18, which are laminated in turn on the substrate. The seed layer 17 is a Ta film having the film thickness of 20 nm. The anti-ferromagnetic layer 12 is a PtMn film having the film thickness of 20 nm. The fixed magnetic layer 13 is composed of a CoFe film having the film thickness of 2.5 nm, a Ru film having the film thickness of 0.88 nm and a CoFe film having the film thickness of 2.5 nm. The barrier layer 14 is a film in which an Al film having the film thickness of 1 nm is oxidized. The free magnetic layer 15 has the magnetic films of alternately laminated two layers and one non-magnetic film. The first magnetic film 21-1 is composed of a NiFe film having the film thickness of 4 nm and a CoFe film having the film thickness of 0.5 nm. The non-magnetic film (anti-ferromagnetic coupling film) is a Ru film having the film thickness of 2.1 nm. The second magnetic film 21-2 is composed of a NiFe film having the film thickness of 2.8 nm and a CoFe film having the film thickness of 0.35 nm. The cap layer 18 is composed of an oxidized Al film having the film thickness of 0.7 nm and a Ta film having the film thickness of 100 nm. In this structure A, the spontaneous magnetizations and the one-axis anisotropic constants are equal to each other between the first magnetic film 21-1 and the second magnetic film 21-2. On the other hand, there is the following relation between the film thickness $t_1$ of the first magnetic film 21-1 and the film thickness $t_2$ of the second magnetic film 21-2.

$$t_2 = 0.7 \times t_1 \qquad (7)$$

FIG. 24 is a graph showing a critical magnetic field curve of the magnetic resistance element having the structure A. This experiment value is related to the simulation result of m=k=1, t=0.7 and hj=2 in the equation (3). In FIG. 24, a curve $H_{Sat}$ corresponds to a curve c in FIG. 13 and indicates the saturation magnetic field $H_{Sat}$. A curve $H_{dir}$ corresponds to a curve b in FIG. 13 and indicates the direct write magnetic field $H_{dir}$. The magnetic fields generated by the write word line 53 and the bit line 55 are assumed to be parallel to the T-direction and the S-direction, respectively.

The direct write magnetic field $H_{dir}$ does not have the S-intercept and the T-intercept, as shown in the drawing. That is, only the magnetic field resulting from any of the write currents is applied to [Half-selection Cells] in which any one of the write word line 53 and the bit line 55 is common to the selection cell. Thus, the write operation is not performed to the half-selection cells. In this way, in case of the first example in which the film thickness difference is given to the MRAM of the SAF structure, the erroneous write operation is greatly reduced as compared with the conventional single-layer free magnetic layer MRAM.

From this simulation, the direct write region was not substantially formed in $0.9 < t \leq 1$, and most of it was the toggle write region. That is, the write region was not substantially increased. On the other hand, in $0 < t < 0.5$, the direct write magnetic field $H_{dir}$ had the S-intercept and the T-intercept, and there was the fear of the occurrence of the erroneous write operation. That is, the range of $0.5 \leq t \leq 0.9$ is desirable. Here, if $t_{br}$ is defined in accordance with the following equation (8), the range of the value of $t_{br}$ is represented by the following equation, since $t = t_2/t_1$.

$$0.05 < t_{br} = \left|\frac{t_1 - t_2}{t_1 + t_2}\right| < 0.3 \qquad (8)$$

FIGS. 25 and 26 are diagrams in which the region of the direct write magnetic field $H_{dir}$ of FIG. 24 is enlarged. FIG. 25 shows the operation region based on the conventional writing method, and FIG. 26 shows the operation region based on this writing method. The curve $H_{Sat}$ indicates the saturation magnetic field $H_{Sat}$. The curve $H_{Sf}$ indicates the flop magnetic field $H_{Sf}$. The curve $H_{dir}$ indicates the direct write magnetic field $H_{dir}$. In the experiment parameters of the experiment example 1, the values of the normalized magnetic field in the magnetization easy axis direction were $H_{dir} = 1.9$, $h_{Sf} = 2.9$ and $H_{Sat} = 30.9$, respectively. However, $h_{dir}$, $h_{Sf}$ and $h_{Sat}$ are values normalized by the equation (3), and $h_{dir} = H_{dir}/H_K$, $h_{Sf} = H_{Sf}/H_K$ and $H_{Sat} = H_{Sat}/H_K$.

In FIG. 25, the region surrounded with the curve $H_{Sat}$, the curve $H_{Sf}$ and the curve $H_{dir}$ is the direct write region. The region surrounded with the curve $H_{Sat}$ and the curve $H_{Sf}$ indicates the toggle write region. In FIG. 24, the region surrounded with the curve $H_{Sat}$ and the curve $H_{dir}$ is this write region.

In this write region, the write operation is possible in both regions of the direct write region and the toggle write region. For this reason, the operation region results in the addition of the direct write region and the toggle write region. That is, the operation region is wider than the single direct write region and the single toggle write region. Also, in the toggle write, the normalized lowest write magnetic field $h_{Sf} = 2.9$. However, in this writing method, the normalized lowest write magnetic field is $h_{dir}$=about 1.9. That is, this writing method can perform the write operation in the write current value of about 65%, as compared with the toggle writing method.

As mentioned above, employing this writing method allows the operation region to be enlarged and the write current value to be reduced.

Second Example

FIG. 27 is a sectional view showing the magnetic resistance element having the structure B. This magnetic resistance element contains a seed layer 17, an anti-ferromagnetic layer 12, a fixed magnetic layer 13, a barrier layer 14, a free magnetic layer 15 and a cap layer 18, which are laminated in turn on the substrate. The seed layer 17 is a Ta film having the film thickness of 20 nm. The anti-ferromagnetic layer 12 is a PtMn film having the film thickness of 20 nm. The fixed magnetic layer 13 is composed of a CoFe film having the film thickness of 2.5 nm, a Ru film having the film thickness of 0.88 nm and a CoFe film having the film thickness of 2.5 nm. The barrier layer 14 is a film in which an Al film having the film thickness of 1 nm is oxidized. The free magnetic layer 15 has the magnetic films of the alternately laminated two layers and the non-magnetic film. The first magnetic film 21-1 is composed of a $Co_{75}Fe_{25}$ film having the film thickness of 2 nm and a CoFeB film having the film thickness of 0.5 nm. The non-magnetic film (anti-ferromagnetic coupling film) is a Ru film having the film thickness of 1.8 nm. The second magnetic film 21-2 is composed of a CoFeB film having the film thickness of 4.5 nm. The cap layer 18 is composed of an oxidized Al film having the film thickness of 0.7 nm and a Ta film having the film thickness of 100 nm. In this structure B, the film thicknesses and the one-axis anisotropic constants are equal between the first magnetic film 21-1 and the second magnetic film 21-2. On the other hand, there is the following relation between the synthesis spontaneous magnetization $M_1$ of the first magnetic film 21-1 and the spontaneous magnetization $M_2$ of the second magnetic film 21-2:

$$M_2 = 0.6 \times M_1$$

FIG. 28 is a graph showing the critical magnetic field curve of the magnetic resistance element having the structure B. This experiment value is related to the simulation result of k=t=1, t=0.6 and $h_j$=3 in the equation (3). On the drawing, the curve $H_{Sat}$ and the curve $H_{dir}$ are similar to a case of FIG. 24. The magnetic fields generated by the write word line 53 and the bit line 55 are assumed to be parallel to the T-direction and the S-direction, respectively.

Also, in this case, the direct write magnetic field $H_{dir}$ does not have the S-intercept and the T-intercept, as shown on the drawing. That is, only the magnetic field resulting from any of the write currents is applied to [Half-selection Cells] in which any one of the write word line 53 and the bit line 55 is common to the selection cell. Thus, the write operation is not performed in the half-selection cells. In this way, in case of the second example in which the film thickness difference is given to the MRAM of the SAF structure, the erroneous write operation is greatly reduced as compared with the conventional single-layer free magnetic layer MRAM.

From this simulation, the direct write region was not substantially formed in 0.9<m≦1, and most of it was the toggle write region. That is, the write region was not substantially increased. On the other hand, in 0<m<0.5, the direct write magnetic field $H_{dir}$ had the S-intercept and the T-intercept, and there was the fear of the occurrence of the erroneous writing. That is, the range of 0.5≦t≦0.9 is desirable. Here, if $M_{br}$ is defined in accordance with the following equation (9), the range of the value of $M_{br}$ is represented by the following equation, since $m=M_2/M_1$.

$$0.05 < M_{br} = \left| \frac{M_1 - M_2}{M_1 + M_2} \right| < 0.3 \quad (9)$$

FIGS. 29 and 30 are graphs in which the region of the direct write magnetic field $H_{dir}$ of FIG. 28 is enlarged. FIG. 29 shows the operation region based on the conventional writing method, and FIG. 30 shows the operation region based on this writing method. The curve $H_{Sat}$, the curve $H_{Sf}$ and the curve $H_{dir}$ are similar to FIGS. 25 and 26. In the experiment parameters of the experiment example 2, the values of the normalized magnetic field in the magnetization easy axis direction were $h_{dir}$=2.2, $h_{Sf}$=5.0 and $h_{Sat}$=6.55, respectively.

In FIG. 29, the region surrounded with the curve $H_{Sat}$, the curve $H_{Sf}$ and the curve $H_{dir}$ is the direct write region. The region surrounded with the curve $H_{Sat}$ and the curve $H_{Sf}$ indicates the toggle write region. In FIG. 30, the region surrounded with the curve $H_{Sat}$ and the curve $H_{dir}$ is this write region.

In this write region, the write operation is possible in both regions of the direct write region and the toggle write region. For this reason, the operation region results in the addition of the direct write region and the toggle write region. That is, the operation region is wider than the single direct write region and the single toggle write region. Also, in the toggle write, the normalized lowest write magnetic field $h_{Sf}$=5.0. However, in this writing method, the normalized lowest write magnetic field is $h_{dir}$=about 2.2. That is, this writing method can perform the write operation in the write current value of about 44%, as compared with the toggle writing method.

As mentioned above, employing this writing method allows the operation region to be enlarged and the write current value to be reduced.

Third Example

FIG. 31 is a sectional view showing the magnetic resistance element having the structure C. This magnetic resistance element contains a seed layer 17, a anti-ferromagnetic layer 12, a fixed magnetic layer 13, a barrier layer 14, a free magnetic layer 15 and a cap layer 18, which are laminated in turn on the substrate. The seed layer 17 is a Ta film having the film thickness of 20 nm. The anti-ferromagnetic layer 12 is a PtMn film having the film thickness of 20 nm. The fixed magnetic layer 13 is composed of a CoFe film having the film thickness of 2.5 nm, a Ru film having the film thickness of 0.88 nm and a CoFe film having the film thickness of 2.5 nm. The barrier layer 14 is a film in which an Al film having the film thickness of 1 nm is oxidized. The free magnetic layer 15 has magnetic films of the alternately laminated two layers and the non-magnetic film. The first magnetic film 21-1 is composed of a CoFeB film having the film thickness of 3.1 nm and a CoFe film having the film thickness of 1.4 nm. The non-magnetic film (anti-ferromagnetic coupling film) is a Ru film having the film thickness of 2.1 nm. The second magnetic film 21-2 is composed of a NiFe film having the film thickness of 4 nm and a CoFe film having the film thickness of 0.5 nm. The cap layer 18 is composed of an oxidized Al film having the film thickness of 0.7 nm and a Ta film having the film thickness of 100 nm. In this structure C, the values of the film thicknesses and the spontaneous magnetizations are equal between the first magnetic film 21-1 and the second magnetic film 21-2. On the other hand, there is the following relation between the one-axis anisotropic constant $K_{U1}$ of the first magnetic film 21-1 and the one-axis anisotropic constant $K_{U2}$ of the second magnetic film 21-2:

$$K_{U2} = 0.4 \times K_{U1} \quad (10)$$

FIG. 32 is a graph showing the critical magnetic field curve of the magnetic resistance element having the structure C. This experiment value is related to the simulation result of m=t=1, t=0.4 and h$_j$=2 in the equation (3). On the drawing, the curve H$_{Sat}$ and the curve H$_{dir}$ are similar to a case of FIG. 24. The magnetic fields generated by the write word line 53 and the bit line 55 are assumed to be parallel to the T-direction and the S-direction, respectively.

Also, in this case, the direct write magnetic field H$_{dir}$ does not have the S-intercept and the T-intercept, as shown in FIG. 32. That is, only the magnetic field resulting from any of the write currents is applied to [Half-selection Cells] in which any one of the write word line 53 and the bit line 55 is common to the selection cell. Thus, the write operation is not performed in the half-selection cells. In this way, in case of the second example in which the difference of the spontaneous magnetization is given to the MRAM of the SAF structure, the erroneous write operation is greatly reduced as compared with the conventional single-layer free magnetic layer MRAM.

From this simulation, the direct write region was not substantially formed in 0.9<k≦1, and most of it was the toggle write region. That is, the write region was not substantially increased. On the other hand, in 0<k<0.1, the region in which the write operation could not be performed was increased, and the effective write region was not substantially increased. That is, the range of 0.1≦k≦0.9 is desirable. Here, if K$_{Ubr}$ is defined in accordance with the following equation (11), the range of the value of K$_{Ubr}$ is represented by the following equation, since k=K$_{U2}$/K$_{U1}$.

$$0.05 < K_{Ubr} = \left| \frac{K_{U1} - K_{U2}}{K_{U1} + K_{U2}} \right| < 0.8 \quad (11)$$

FIGS. 33 and 34 are graphs in which the region of the direct write magnetic field H$_{dir}$ of FIG. 30 is enlarged. FIG. 32 shows the operation region based on the conventional writing method, and FIG. 33 shows the operation region based on this writing method. The curve H$_{Sat}$, the curve H$_{Sf}$ and the curve H$_{dir}$ are similar to FIGS. 25 and 26. In the experiment parameters of the experiment example 3, the values of the normalized magnetic field in the magnetization easy axis direction were h$_{dir}$=1.5, h$_{Sf}$=2.0 and h$_{Sat}$=3.3, respectively.

In FIG. 33, the region surrounded with the curve H$_{Sat}$, the curve H$_{Sf}$ and the curve H$_{dir}$ is the direct write region. The region surrounded with the curve H$_{Sat}$ and the curve H$_{Sf}$ indicates the toggle write region. In FIG. 32, the region surrounded with the curve H$_{Sat}$ and the curve H$_{dir}$ is this write region.

In this write region, the write operation is possible in both regions of the direct write region and the toggle write region. For this reason, the operation region results in the addition of the direct write region and the toggle write region. That is, the operation region is wider than the single direct write region and the single toggle write region. Also, in the toggle write, the normalized lowest write magnetic field is h$_{Sf}$=2.0. However, in this writing method, the normalized lowest write magnetic field is h$_{dir}$=about 1.5. That is, this writing method can perform the write operation in the write current value of about 75%, as compared with the toggle writing method.

As mentioned above, employing this writing method can allow the operation region to be enlarged and the write current value to be reduced.

As mentioned above, in the MRAM of the present invention, the writing method is configured by the read operation from and write operation to the memory cell. Using this method enlarges the operation region. Also, the write current is decreased, and the electric power consumption is reduced.

In addition, the area of the memory cells inside the MRAM can be made relatively wide, or the size of the MRAM can be made small. Moreover, the manufacturing margins of the spontaneous magnetization and the film thickness are made wide, which can improve the manufacturing yield of the MRAM.

It should be noted that in FIGS. 24, 28 and 32, the curve of the direct write magnetic field H$_{dir}$ is designed so as not to have the S-intercept and the T-intercept, in order to prevent the erroneous write operation. However, if the S-intercept and the T-intercept are greater than a word line vertical magnetic field H$_{WL}$ and a bit line vertical magnetic field H$_{BL}$, the S-intercept and the T-intercept may be possessed. This is because the erroneous write operation does not occur in the half-selection cells to which any one of the word line vertical magnetic field H$_{WL}$ and the bit line vertical magnetic field H$_{BL}$ is applied.

In the foregoing description, the free magnetic layer 15 includes the magnetic films 21-1, 21-2 of the two layers coupled through the non-magnetic layer to each other in the anti-ferromagnetic manner. However, the magnetic films included in the free magnetic layer 15 may have the 2n layers (n: an integer of 1 or more). That is, this is established even when in the free magnetic layer 15, the magnetic films of the two layers adjacent to each other are coupled through the non-magnetic layer to each other in the anti-ferromagnetic manner. FIG. 35 is a sectional view showing another structure of the magnetic resistance element of the MRAM in the embodiment of the present invention. This magnetic resistance element 1 includes a lower electrode 11, an anti-ferromagnetic layer 12, a fixed magnetic layer 13, a barrier layer 14, a free magnetic layer 15 and an upper electrode layer 16. The free magnetic layer 15 includes any one of magnetic layers of the (2n+1) layers (n: an integer of 1 or more) and the (2n) layers. FIG. 35 shows a case of the (2n) layers.

In case of the (2n+1) layer, this includes a magnetic film 21-(2p-1) of an odd-numbered (2p-1) layer (p=1 to n+1: integer); a magnetic film 21-(2p) of an even-numbered (2p) layer (p=1 to n: integer); and non-magnetic films 23-(2p-1), (2p) (p=1 to n: integer) provided between the respective magnetic layers.

On the other hand, in case of the (2n) layer, this includes: a magnetic film 21-(2p-1) of an odd-numbered (2p-1) layer (p=1 to n+1: integer); a magnetic film 21-(2p) of an even-numbered (2p) layer (p=1 to n: integer); and a non-magnetic films 23-(2p-1), (2p) (p=1 to (n-1): integer) of the (2n) layer so that the non-magnetic film and the magnetic layer are alternately provided. In this case, the following equations (1), (9), (8) and (11) are as represented by the following equations (12), (13), (14) and (15). However, Ms$_{2p-1}$ and Ms$_{2p}$ indicate the spontaneous magnetizations of the magnetic layers of the (2p-1)-th layer and the 2p-th layer, respectively. T$_{2p-1}$ and t$_{2p}$ indicate the film thicknesses of the magnetic layers of the (2p-1)-th layer and the 2p-th layer, respectively. K$_{U2p-1}$ and K$_{U2p}$ indicate the one-axis anisotropic constants of the magnetic layers of the (2p-1)-th layer and the 2p-th layer, respectively. It is assumed to be q=n+1 at the time of the (2n+1) layers and q=n at the time of the 2n layers, and q is an integer.

$$\sum_{p=1}^{q} (Ms_{2p-1} \times t_{2p-1}) \neq \sum_{p=1}^{q} (Ms_{2p} \times t_{2p}) \quad (12)$$

$$0.05 < t_{br} = \left| \frac{\sum_{p=1}^{q} t_{2p-1} - \sum_{p=1}^{q} t_{2p}}{\sum_{p=1}^{q} t_{2p-1} + \sum_{p=1}^{q} t_{2p}} \right| < 0.3 \quad (13)$$

-continued $$0.05 < M_{br} = \left| \frac{\sum_{p=1}^{q} M_{2p-1} - \sum_{p=1}^{q} M_{2p}}{\sum_{p=1}^{q} M_{2p-1} + \sum_{p=1}^{q} M_{2p}} \right| < 0.3 \quad (14)$$

$$0.05 < K_{Ubr} = \left| \frac{\sum_{p=1}^{q} K_{U2p-1} - \sum_{p=1}^{q} K_{U2p}}{\sum_{p=1}^{q} K_{U2p-1} + \sum_{p=1}^{q} K_{U2p}} \right| < 0.8 \quad (15)$$

Also, here, a case that the layer number of the magnetic films in the free magnetic layer 15 is even is described. However, even in the odd-numbered case, the foregoing respective equations can be established, which allows the obtainment of the effects similar to the case that the magnetic films of the free magnetic layer have the two layers.

According to the present invention, the write operation region in the MRAM of the SAF structure is enlarged. According to the present invention, the write current in the MRAM of the SAF structure is decreased. According to the present invention, the manufacturing yield of the MRAM of the SAF structure is improved.

The invention claimed is:

1. A writing method of a magnetic random access memory, which comprises:
    a plurality of first wirings arranged to extend in a first direction;
    a plurality of second wirings arranged to extend in a second direction which is substantially orthogonal to said first direction;
    a free magnetic layer in which a plurality of magnetic layers coupled to each other anti-ferromagnetically through non-magnetic layers and said non-magnetic layers are laminated; and
    a plurality of memory cells for points at which said plurality of first wirings and said plurality of second wirings intersect,
    a direction of a magnetization easy axis of said free magnetic layer is different between said first direction and said second direction,
    said writing method comprising:
    (a) reading a first data stored in a selection cell selected from said plurality of memory cells;
    (b) comparing a second data to be written to said selection cell and said first data; and
    (c) when said first data and said second data are different from each other:
    when said second data is a first particular data, supplying a first write current to a first direction of a selection first wiring, corresponding to the selection cell, of said plurality of first wirings, and supplying a second write current to a second direction of a selection second wiring, corresponding to said selection cell, of said plurality of second wirings; and when said second data is a second particular data different from the first particular data, supplying a third write current to a third direction opposite to the first direction of said selection first wiring, and supplying a fourth write current to a fourth direction opposite to the second direction of said selection second wiring.

2. The writing method of the magnetic random access memory according to claim 1, wherein said (c) supplying:

(c1) when said second data is the first particular data, supplying said first write current in the first direction of said selection first wiring, supplying said second write current in the second direction of said selection second wiring, subsequently, stopping said first write current, and then stopping said second write current; and (c2) when said second data is the second particular data different from said first particular data, supplying a third write current into the third direction opposite to said first direction of said selection first wiring, supplying a fourth write current into the fourth direction opposite to the second direction of said selection second wiring, subsequently stopping said third write current, and then stopping said fourth write current.

3. The writing method of the magnetic random access memory according to claim 1, wherein said free magnetic layer has two layers of a first magnetic film and a second magnetic film, and a spontaneous magnetization $M_1$ and a film thickness $t_1$ of said first magnetic film and a spontaneous magnetization $M_2$ and a film thickness $t_2$ of said second magnetic film satisfy $M_1 \times t_1 \neq M_2 \times t_2$.

4. The writing method of the magnetic random access memory according to claim 1, wherein said free magnetic layer has two layers of a first magnetic film and a second magnetic film, and a spontaneous magnetization $M_1$ of said first magnetic film and a spontaneous magnetization $M_2$ of said second magnetic film satisfy the following relation:

$$0.05 < M_{br} = \left| \frac{M_1 - M_2}{M_1 + M_2} \right| < 0.3.$$

5. The writing method of the magnetic random access memory according to claim 1, wherein said free magnetic layer has two layers of a first magnetic film and a second magnetic film, and a film thickness $t_1$ of said first magnetic film and a film thickness $t_2$ of said second magnetic film satisfy the following relation:

$$0.05 < t_{br} = \left| \frac{t_1 - t_2}{t_1 + t_2} \right| < 0.3.$$

6. The writing method of the magnetic random access memory according to claim 1, wherein said free magnetic layer has two layers of a first magnetic film and a second magnetic film, and a one-axis anisotropic constant $K_{U1}$ of said first magnetic film and a one-axis anisotropic constant $K_{U2}$ of said second magnetic film satisfy the following relation:

$$0.05 < K_{Ubr} = \left| \frac{K_{U1} - K_{U2}}{K_{U1} + K_{U2}} \right| < 0.8.$$

7. The writing method of the magnetic random access memory according to claim 1, wherein said free magnetic layer comprises magnetic layers of one of (2n+1) layers (n: an integer of 1 or more) and 2n layers, and a spontaneous magnetization $Ms_{2p-1}$ and a film thickness $t_{2p-1}$ of a (2p−1)-th layer and a spontaneous magnetization $Ms_{2p}$ and a film thickness $t_{2p}$ of a 2p-th layer satisfy the following equation, by setting q=n+1 in case of the (2n+1) layers and q=n in case of the 2n layers:

$$\sum_{p=1}^{q}(Ms_{2p-1} \times t_{2p-1}) \neq \sum_{p=1}^{q}(Ms_{2p} \times t_{2p}).$$

8. The writing method of the magnetic random access memory according to claim 1, wherein said free magnetic layer comprises a magnetic layer of one of (2n+1) layers (n: an integer of 1 or more) and 2n layers, and a film thickness $t_{2p-1}$ of the magnetic layer of the (2p−1)-th layer and the film thickness $t_{2p}$ of the magnetic layer of the 2p-th layer satisfy the following equation, by setting q=n+1 in case of the (2n+1) layers and q=n in case of the 2n layers:

$$0.05 < t_{br} = \left| \frac{\sum_{p=1}^{q} t_{2p-1} - \sum_{p=1}^{q} t_{2p}}{\sum_{p=1}^{q} t_{2p-1} + \sum_{p=1}^{q} t_{2p}} \right| < 0.3.$$

9. The writing method of the magnetic random access memory according to claim 1, wherein said free magnetic layer comprises magnetic layers of one of (2n+1) layers (n: an integer of 1 or more) and 2n layers, and a spontaneous magnetization $Ms_{2p-1}$ of the magnetic layer of a (2p−1)-th layer and a spontaneous magnetization $Ms_{2p}$ of the magnetic layer of a 2p-th layer satisfy the following equation, by setting q=n+1 in case of the (2n+1) layers and q=n in case of the 2n layers:

$$0.05 < M_{br} = \left| \frac{\sum_{p=1}^{q} M_{2p-1} - \sum_{p=1}^{q} M_{2p}}{\sum_{p=1}^{q} M_{2p-1} + \sum_{p=1}^{q} M_{2p}} \right| < 0.3.$$

10. The writing method of the magnetic random access memory according to claim 1, wherein said free magnetic layer comprises magnetic layers of one of (2n+1) layers (n: an integer of 1 or more) and 2n layers, and a one-axis anisotropic constant $K_{U2p-1}$ of the magnetic layer of a (2p−1)-th layer and a one-axis anisotropic constant $K_{U2p}$ of the magnetic layer of a 2p-th layer satisfy the following equation, by setting q=n+1 in case of the (2n+1) layers and q=n in case of the 2n layers:

$$0.05 < K_{Ubr} = \left| \frac{\sum_{p=1}^{q} K_{U2p-1} - \sum_{p=1}^{q} K_{U2p}}{\sum_{p=1}^{q} K_{U2p-1} + \sum_{p=1}^{q} K_{U2p}} \right| < 0.8.$$

11. A magnetic random access memory comprising:
a plurality of first wirings arranged to extend in a first direction;
a plurality of second wirings arranged to extend in a second direction substantially orthogonal to the first direction;
a free magnetic layer formed by laminating a plurality of magnetic layers which are anti-ferromagnetically coupled to each other through non-magnetic layers;
a plurality of memory cells provided in correspondence to points at which said plurality of first wirings and said plurality of second wirings intersect, wherein a direction of a magnetization easy axis of said free magnetic layer is different from the first direction and the second direction;
a read determination section configured to compare a first data stored in a selection memory cell and a second data, when said second data is written in said selection memory cell selected from said plurality of memory cells based on a selection first wiring selected from the plurality of first wiring and a selection second wiring selected from the plurality of second wirings; and
a current control section configured to control, when said first data and said second data are different when said second data is a first particular data,
a first write current to be supplied to a first direction of said selection first wiring and a second write current to be supplied to a second direction of said selection second wiring; when said second data is a second particular data different from the first particular data, said first write current to be supplied to a third direction opposite to the first direction of said selection first wiring and said second write current to be supplied to a fourth direction opposite to the second direction of said selection second wiring.

12. The magnetic random access memory according to claim 1, wherein said current control section:
when said second data is the first particular data, supplies said first write current in the first direction of said selection first wiring, subsequently supplies said second write current in the second direction of said selection second wiring, subsequently, stops the supply of said first write current, and then stops the supply of said second write current; and
when said second data is the second particular data different from said first particular data, supplies said first write current into the third direction opposite to said first direction of said selection first wiring, subsequently supplies said second write current into the fourth direction opposite to the second direction of said selection second wiring, subsequently stops the supply of said first write current, and then stops the supply of said second write current.

13. The magnetic random access memory according to claim 11, wherein a direction of a magnetization easy axis direction of said free magnetic layer has an angle of about 45 degrees with respect to the first direction and the second direction.

14. The magnetic random access memory according to claim 11, wherein said current control section comprises:
a first current direction controller configured to output the first write current and the second write current to supply the first write current to the first direction of the selection first wiring and to supply the second write current to the second direction of the selection second wiring, when the second data is the first particular data; and
a second current direction controller configured to output the first write current and the second write current to supply the first write current to the third direction opposite to the first direction of the selection first wiring and to supply the second write current to the fourth direction opposite to the second direction of the selection second wiring, when the second data is the second particular data different from the first particular data.

15. The magnetic random access memory according to claim 14, wherein said current control section further comprises:
- a first current source configured to supply the first write current to one of said first current direction controller and said second current direction controller;
- a second current source configured to supply the second write current to one of said first current direction controller and said second current direction controller; and
- a write controller configured to control timings of the current supplies to the first current source and the second current source.

16. The magnetic random access memory according to claim 15, wherein said write controller controls the timings by turning on/off said first current source and said second current source.

17. The magnetic random access memory according to claim 15, further comprising:
- a first X selector connected to one ends of said plurality of first wirings and configured to select said selection first wiring;
- a second X selector connected to the other ends of said plurality of first wirings and configured to select said selection first wiring;
- a first Y selector connected to one ends of said plurality of second wirings and configured to select said selection second wiring; and
- a second Y selector connected to the other ends of said plurality of second wirings and configured to select said selection second wiring,
- wherein when said second data is the first particular data, said first current source outputs the first write current to the first current direction controller, said second current source outputs the second write current to the first current direction controller, and the first current direction controller outputs the first write current to said first X selector and outputs the second write current to said first Y selector,
- when said second data is the second particular data, said first current source outputs the first write current to the second current direction controller, said second current source outputs the second write current to the second current direction controller, and said second current direction controller outputs the first write current to said second X selector and outputs the second write current to said second Y selector.

18. The magnetic random access memory according to claim 11, wherein said free magnetic layer is two layers of a first magnetic film and a second magnetic film, and a spontaneous magnetization $M_1$ and a film thickness $t_1$ of said first magnetic film and a spontaneous magnetization $M_2$ and a film thickness $t_2$ of said second magnetic film satisfy $$M_1 \times t_1 \neq M_2 \times t_2.$$

19. The magnetic random access memory according to claim 11, wherein said free magnetic layer has two layers of a first magnetic film and a second magnetic film, and a spontaneous magnetization $M_1$ of said first magnetic film and a spontaneous magnetization $M_2$ of said second magnetic film satisfy the following equation:

$$0.05 < M_{br} = \left| \frac{M_1 - M_2}{M_1 + M_2} \right| < 0.3.$$

20. The magnetic random access memory according to claim 11, wherein said free magnetic layer has two layers of a first magnetic film and said second magnetic film, and a film thickness $t_1$ of said first magnetic film and a film thickness $t_2$ of said second magnetic film satisfy the following equation:

$$0.05 < t_{br} = \left| \frac{t_1 - t_2}{t_1 + t_2} \right| < 0.3.$$

21. The magnetic random access memory according to claim 11, wherein said free magnetic layer has two layers of a first magnetic film and a second magnetic film, and a one-axis anisotropic constant $K_{U1}$ of said first magnetic film and a one-axis anisotropic constant $K_{U2}$ of said second magnetic film satisfy the following relation:

$$0.05 < K_{Ubr} = \left| \frac{K_{U1} - K_{U2}}{K_{U1} + K_{U2}} \right| < 0.8.$$

22. The magnetic random access memory according to claim 11, wherein said free magnetic layer comprises magnetic layers of one of (2n+1) layers (n: an integer of 1 or more) and 2n layers, and a spontaneous magnetization $Ms_{2p-1}$ and a film thickness $t_{2p-1}$ of the magnetic layer of a (2p−1)-th layer and a spontaneous magnetization $Ms_{2p}$ and a film thickness $t_{2p}$ of the magnetic layer of a 2p-th layer satisfy the following equation, by setting q=n+1 in case of the (2n+1) layers and q=n in case of the 2n layers:

$$\sum_{p=1}^{q} (Ms_{2p-1} \times t_{2p-1}) \neq \sum_{p=1}^{q} (Ms_{2p} \times t_{2p}).$$

23. The magnetic random access memory according to claim 11, wherein said free magnetic layer comprises magnetic layers of one of (2n+1) layers (n: an integer of 1 or more) and 2n layers, and a film thickness $t_{2p-1}$ of the magnetic layer of a (2p−1)-th layer and a film thickness $t_{2p}$ of the magnetic layer of a 2p-th layer satisfy the following equation, by setting q=n+1 in case of the (2n+1) layers and q=n in case of the 2n layers:

$$0.05 < t_{br} = \left| \frac{\sum_{p=1}^{q} t_{2p-1} - \sum_{p=1}^{q} t_{2p}}{\sum_{p=1}^{q} t_{2p-1} + \sum_{p=1}^{q} t_{2p}} \right| < 0.3.$$

24. The magnetic random access memory according to claim 11, wherein said free magnetic layer comprises magnetic layers of one of (2n+1) layers (n: an integer of 1 or more) and 2n layers, and a spontaneous magnetization $Ms_{2p-1}$ of the magnetic layer of a (2p−1)-th layer and a spontaneous magnetization $Ms_{2p}$ of the magnetic layer of a 2p-th layer satisfy the following equation, by setting q=n+1 in case of the (2n+1) layers and q=n in case of the 2n layers:

$$0.05 < M_{br} = \left| \frac{\sum_{p=1}^{q} M_{2p-1} - \sum_{p=1}^{q} M_{2p}}{\sum_{p=1}^{q} M_{2p-1} + \sum_{p=1}^{q} M_{2p}} \right| < 0.3.$$

25. The magnetic random access memory according to claim 11, wherein said free magnetic layer comprises magnetic layers of one of (2n+1) layers (n: an integer of 1 or more) and 2n layers, and a one-axis anisotropic constant $K_{U2p-1}$ of the magnetic layer of a (2p−1)-th layer and a one-axis anisotropic constant $K_{U2p}$ of the magnetic layer of a 2p-th layer satisfy the following equation, by setting q=n+1 in case of the (2n+1) layers and q=n in case of the 2n layers:

$$0.05 < K_{Ubr} = \left| \frac{\sum_{p=1}^{q} K_{U2p-1} - \sum_{p=1}^{q} K_{U2p}}{\sum_{p=1}^{q} K_{U2p-1} + \sum_{p=1}^{q} K_{U2p}} \right| < 0.8.$$

* * * * *